US005609721A

United States Patent [19]
Tsukune et al.

[11] Patent Number: 5,609,721
[45] Date of Patent: Mar. 11, 1997

[54] SEMICONDUCTOR DEVICE MANUFACTURING APPARATUS AND ITS CLEANING METHOD

[75] Inventors: Atsuhiro Tsukune; Kiyokatsu Suzuki; Katsuyoshi Matsuura; Fumitake Mieno; Hirokazu Yamanishi, all of Kawasaki, Japan

[73] Assignee: Fujitsu Limited, Kawasaki, Japan

[21] Appl. No.: 367,828

[22] Filed: Jan. 3, 1995

[30] Foreign Application Priority Data

Mar. 11, 1994 [JP] Japan .................................. 6-041335
Sep. 19, 1994 [JP] Japan .................................. 6-223335

[51] Int. Cl.⁶ .................................................. C23C 16/00
[52] U.S. Cl. ............................. 156/646.1; 134/22.11; 216/58
[58] Field of Search ............................. 156/643.1, 646; 134/1.1, 22.1, 22.11, 22.12, 22.18; 216/58, 67; 427/585

[56] References Cited

U.S. PATENT DOCUMENTS

| | | | |
|---|---|---|---|
| 4,998,979 | 3/1991 | Niino | 134/1 |
| 5,030,319 | 7/1991 | Nishino et al. | 134/31 X |
| 5,254,176 | 10/1993 | Ibuka et al. | 134/2 |
| 5,294,262 | 3/1994 | Nishimura | 134/22.1 |
| 5,380,370 | 1/1995 | Niino et al. | 134/22.11 |
| 5,421,957 | 6/1995 | Carlson et al. | 216/58 |
| 5,427,621 | 6/1995 | Gupta | 134/1 |

FOREIGN PATENT DOCUMENTS 5-226270 9/1993 Japan .
2143 1/1994 Japan .

*Primary Examiner*—Thi Dang
*Attorney, Agent, or Firm*—Nikaido, Marmelstein, Murray & Oram LLP

[57] ABSTRACT

An apparatus and method for manufacturing a semiconductor device includes a reaction chamber adapted to exhaust gas therefrom, and a cleaning gas supplying system for introducing cleaning gas containing $ClF_3$ into the reaction chamber, the system having a plurality of gas blowout holes formed in the flow direction of gas at least in the reaction chamber. The reaction chamber may be a tubular chamber, and the cleaning gas supplying system may be a tube extending from one end to the other end of the reaction chamber along the inner wall or the central axis of the reaction chamber, a plurality of through holes being formed in the side wall of the tube. Damages to the inner surface of the reaction chamber of the semiconductor device manufacturing apparatus can be suppressed and a film attached to the inner wall of the reaction chamber can be removed in a short time.

21 Claims, 23 Drawing Sheets

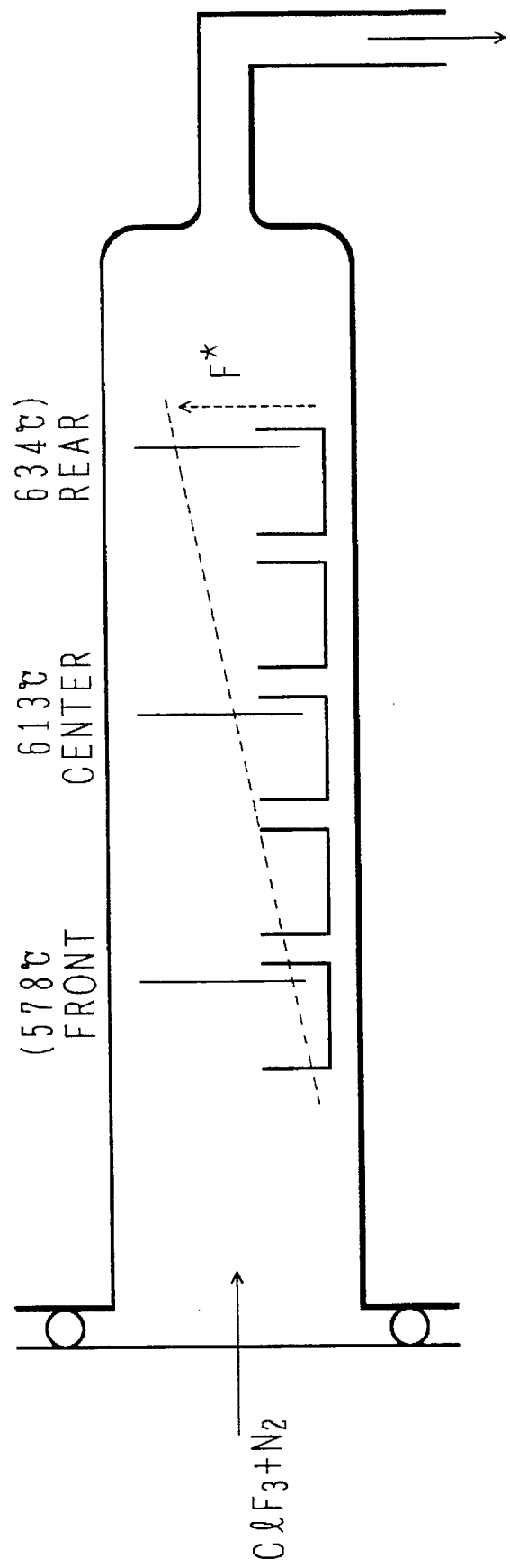

5,609,721

SEMICONDUCTOR DEVICE MANUFACTURING APPARATUS AND ITS CLEANING METHOD

BACKGROUND OF THE INVENTION a) Field of the Invention

The present invention relates to cleaning a reaction chamber and its tubes of a semiconductor device manufacturing apparatus by using $ClF_3$.

b) Description of the Related Art

Thin film forming techniques such as chemical vapor deposition (CVD) and physical vapor deposition (PVD) are incorporated in semiconductor device manufacturing processes. As a thin film is formed by such a technique on a semiconductor substrate placed in a reaction chamber, a thin film is also grown on the inner wall of the reaction chamber and the surfaces of jigs. As the attached thin film becomes thick, for example, to several tens μm, a fraction of the thin film peels off as particles. Particles may cause a low manufacturing yield. It is therefore necessary for a thin film forming apparatus to be subjected to routine cleaning for removing attached films.

Cleaning is broadly classified into wet cleaning and dry cleaning. For example, in wet-cleaning silicon based thin films, a reaction tube and jigs are dipped in a mixed solution of hydrofluoric acid and nitric acid. During the whole cleaning process, a thin film forming apparatus is cooled to the room temperature and disassembled into a reaction tube and jigs which are then wet-cleaned and reassembled into a thin film forming apparatus which is again heated. The most common current process takes at least 16 to 24 hours.

Dry cleaning is performed without disassembling a thin film forming apparatus into a reaction tube and jigs and without cooling the apparatus. Therefore, dry cleaning is called in situ cleaning. The whole cleaning process can be simplified considerably, improving apparatus uptime and throughput. The number of heating/cooling cycles is reduced, prolonging the service life time of a reaction tube. Dry cleaning is particularly useful for a reaction tube such as a quartz reaction tube with a thin film of a different thermal expansion coefficient being attached thereto, because if the tube is cooled, thermal stress causes the generation of cracks on the inner surface of the quartz tube. The tube with more cracks should be discarded because it is mechanically weaker.

Known dry cleaning gas is a gas containing fluorine such as $NF_3$ and $ClF_3$. $NF_3$ gas is used in the plasma assisted etch processing whereas $ClF_3$ gas is used as it is. As a cleaning gas for a thin film forming apparatus without a plasma formation device, $ClF_3$ is therefore more attractive.

Exhaust gases, produced during $ClF_3$ gas cleaning process, are quite toxic and should be removed quickly. It is also desired to prevent metal and sealing materials from being corroded by cleaning gas. From these reasons, $ClF_3$ gas is used by diluting it by a large amount of inert gas such as $N_2$ and Ar. If an adsorption type toxic waste remover or another type toxic waste remover such as a scrubber is used, $ClF_3$ gas diluted to 5% or smaller is generally introduced into a reaction chamber. In this case, even if an exothermic reaction occurs in a toxic waste remover, the temperature of the remover can be suppressed to be about 40° C. or lower, ensuring the safety of operation.

A method of cleaning a semiconductor device manufacturing apparatus by using $ClF_3$ is disclosed in Japanese Patent Laid-open Publication No. 5-226270.

FIG. 8A is a schematic cross sectional diagram of a CVD system for forming a film of tungsten (W) or tungsten silicide (WSi) reproduced from the Publication No. 5-226270. A susceptor 101 for supporting a substrate is disposed at the center of the bottom of a reaction chamber 100 made of aluminum or the like. A substrate 102 is placed on the susceptor 101 to deposit a film on the substrate 102.

The tip of a gas pipe 104 is guided into the chamber 100 above the susceptor 101. A perforated plate 103 is mounted surrounding the tip of the gas pipe 104. Source gas or cleaning gas blown out of the tip of the gas pipe 104 is introduced into the reaction chamber 100 via holes of the perforated plate 103.

A drain pipe 105 is coupled to the bottom of the reaction chamber 100, and is communicating with a vacuum pump (not shown). The source gas or cleaning gas in the reaction chamber 100 is exhausted via the pipe 105.

FIG. 8B is a schematic cross sectional view of a conventional lateral type CVD system. Flanges 111 and 112 are mounted on opposite ends of a reaction tube 110 made of quartz or the like. A gas pipe 114 is coupled to the side wall of the flange 111 so that cleaning gas containing $ClF_3$ can be introduced. The center hole of the flange 111 is sealed by a cap 113.

A drain pipe 115 is coupled to the other flange 112 so that gas in the reaction tube 110 can be exhausted. A heater 116 is installed surrounding the reaction tube 110.

Cleaning gas introduced into the reaction chamber 100 shown in FIG. 8A or into the reaction tube 110 etches a film attached to the inner wall when films have been deposited on substrates, the attached film containing tungsten, tungsten silicide, polycrystalline, silicon, or other substances. The cleaning gas after etching is exhausted to the outside of the drain pipe 105 or 115. The inner wall of the reaction chamber 100 or the reaction tube 110 can be cleaned in the above manner.

With the conventional cleaning method described above, cleaning gas reacted with the attached film at the upstream region flows downstream. Therefore, the concentration of $ClF_3$ is high at the upstream region, and low at the downstream region. The etching rate at the inner wall of the chamber or tube is therefore high at the upstream region.

Although $ClF_3$ etches polycrystalline silicon attached to the inner wall of the chamber or tube, it also etches a small amount of quartz itself. Therefore, if a reaction chamber made of quartz is cleaned, the cleaned inner wall, e.g. at the upstream gas region is likely to be damaged.

The inner wall of the drain pipe is cleaned slightly by residual $ClF_3$ in the exhausted cleaning gas, but its cleaning effect is relatively small. A gas supply pipe used only for supplying gas for the deposition of a film on a substrate is not cleaned at all.

In order to improve a throughput of a manufacturing apparatus, it is necessary to increase an etching rate and reduce a cleaning time. An increase of an etching rate requires an increased flow rate of $ClF_3$ which raises cost.

Furthermore, since the thickness of a polycrystalline silicon film attached to the inner wall of a chamber is not uniform, the chamber inner wall is exposed at the thin film area after the film is fully etched. The exposed area is overetched by $ClF_3$ and damaged. As a result, as the cleaning is repeated, the transparency of the quartz chamber is lost (devitrificated).

SUMMARY OF THE INVENTION

It is an object of the present invention to provide a cleaning technique capable of suppressing damages on the inner wall of a reaction chamber of a semiconductor device manufacturing apparatus and removing an attached film in a short time.

According to one aspect of the present invention, there is provided an apparatus for manufacturing a semiconductor device including: a reaction chamber adapted to exhaust gas therefrom; and first cleaning gas supplying means for introducing cleaning gas containing $ClF_3$ into the reaction chamber, the means having a plurality of gas blowout holes formed at different positions in the flow direction of gas at least in the reaction chamber.

The reaction chamber may be a tubular chamber, and the first cleaning gas supplying means may be a tube extending from one end to the other end of the reaction chamber along the inner wall or the central axis of the reaction chamber, a plurality of through holes being formed in the side wall of the tube.

Gas switching means may be provided for selectively supplying the cleaning gas to at least one or more of the plurality of gas blowout holes. Controlling means may be provided for variably controlling a cleaning speed of the cleaning gas containing $ClF_3$.

According to another aspect of the present invention, there is provided a method of cleaning a reaction chamber of a semiconductor device manufacturing apparatus by supplying cleaning gas containing $ClF_3$ to the reaction chamber, the reaction chamber being adapted to exhaust gas therefrom, the method including the step of adding alcohol vapor to the cleaning gas.

According to a further aspect of the present invention, there is provided a method of removing a film attached to the inner wall of a reaction chamber of a semiconductor device manufacturing apparatus by supplying cleaning gas containing $ClF_3$ to the reaction chamber, the reaction chamber being adapted to exhaust gas therefrom, the method including the steps of: supplying the cleaning gas to the reaction chamber under a first cleaning condition at the initial stage of cleaning; and changing the cleaning condition so as to lower an etching rate by the cleaning gas of a material constituting the reaction chamber than an etching rate under the first cleaning condition at the initial stage of cleaning.

According to a still further aspect of the invention, there is provided a method of removing a film attached to the inner wall of a reaction chamber of a semiconductor device manufacturing apparatus by supplying cleaning gas containing $ClF_3$ to the reaction chamber, the reaction chamber being adapted to exhaust gas therefrom, the method including the steps of: supplying the cleaning gas to the reaction chamber only via some of a plurality of gas inlet ports provided for the reaction chamber; and switching the gas inlet ports to stop supplying the cleaning gas via some of the gas inlet ports, and to start supplying the cleaning gas via another of the gas inlet ports.

Cleaning gas is supplied generally uniformly into the reaction chamber so that an attached film can be etched generally uniformly. Accordingly, a partial overetch of the inner wall of the reaction chamber can be reduced.

Time sequential supply of cleaning gas by switching between a plurality of cleaning gas introducing means provided for the reaction chamber allows the cleaning gas to be supplied only to the region where a film attached to the inner wall of the reaction chamber is left, without supplying the gas to the region where the film has already been removed. Accordingly, it is possible to suppress an overetch of the inner wall of the reaction chamber at the region where the film has already been removed.

Addition of alcohol vapors to cleaning gas raises the etching rate and shorten the cleaning time.

An overetch of the material constituting the reaction chamber can be suppressed by detecting the timing when the thickness of a film attached the inner wall of the reaction chamber becomes thin, and by changing the cleaning gas supply condition so as to lower the etching rate of the reaction chamber material.

BRIEF DESCRIPTION OF THE DRAWINGS

FIG. 15 is a schematic diagram illustrating a change in the amount of fluorine radicals in a reaction tube.

DETAILED DESCRIPTION OF THE PREFERRED EMBODIMENTS

The first embodiment of the invention will be described with reference to FIG. 1.

Figure 1:
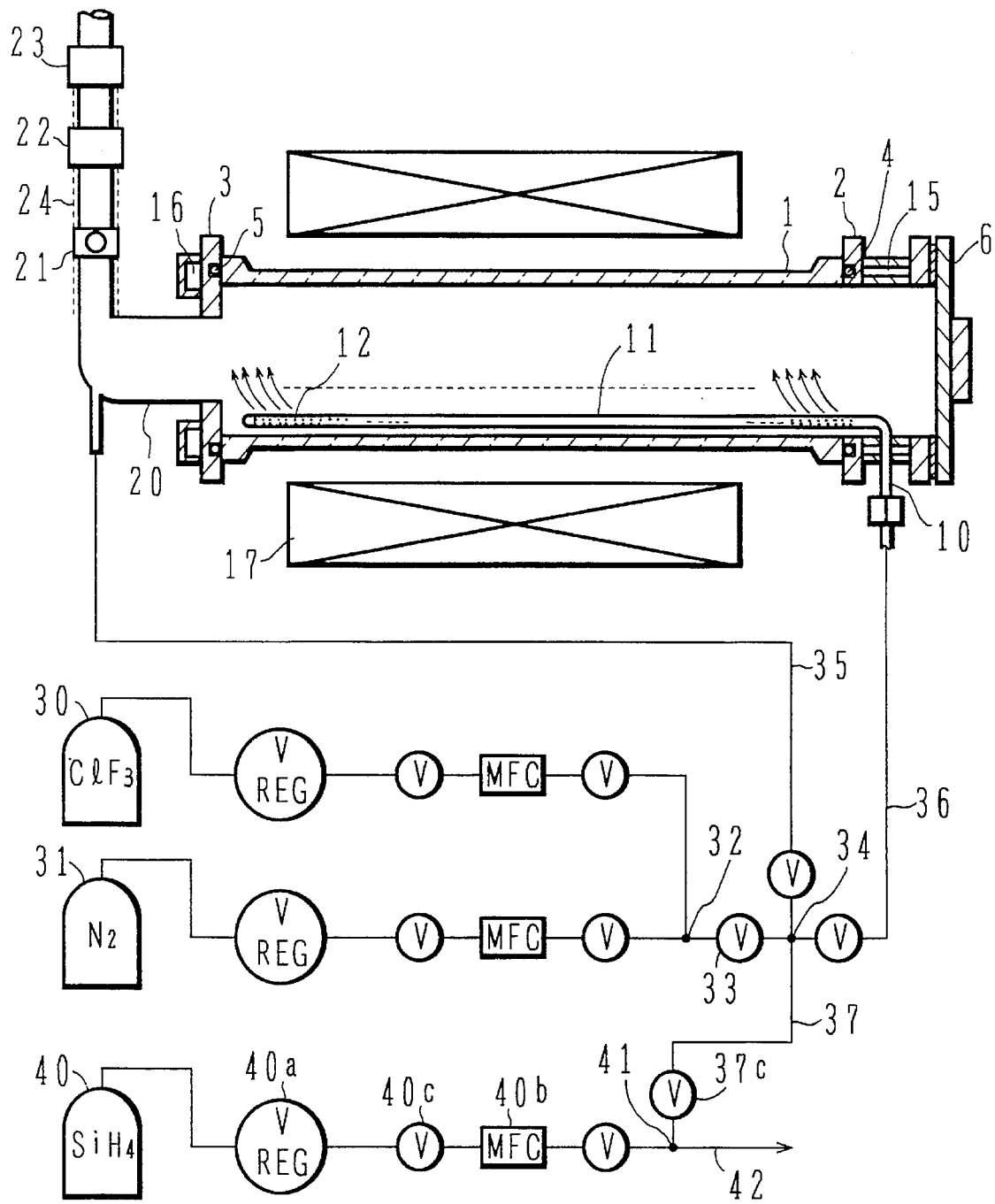
FIG. 1 is a schematic cross sectional view of a CVD system with a gas supply system given in block, according to a first embodiment of the invention.

FIG. 1 is a schematic cross sectional view of a CVD system with a gas supply system given in block, showing the first embodiment. A quartz reaction tube 1 with an inner diameter of 20 cm, an outer diameter of 21 cm, and a length of 200 cm has manifold flanges 2 and 3 mounted on opposite ends of the tube 1. The interfaces between the reaction tube 1 and the manifold flanges 2 and 3 are hermetically coupled together by O rings 4 and 5.

A cap 6 is mounted on the manifold flange 2 to seal the center hole of the manifold flange 2.

A drain pipe 20 is connected to the center of the flange 3, and coupled via a hot valve 21 to a vacuum pump 22. A detoxifier 23 is connected to the exhaust side of the vacuum pump 22 to exhaust gas in the reaction tube 1 as nontoxic gas. The vacuum pump 22 is constructed of, for example, a preliminary exhaust dry pump and a main exhaust mechanical booster pump. A heating pipe 24 is disposed surrounding the exhaust pipe 20 to heat the latter.

A gas inlet port 10 is provided at the side wall of the manifold flange 2. A shower nozzle 11 is fitted in the gas inlet port 10, and extends near to the exhaust side flange 3 along the inner wall off the reaction tube 1. The shower nozzle 11 is made of quartz and has an outer diameter of 6.2 mm, an inner diameter of 4.2 mm, and a length of 160 cm. A number of gas jet holes 12 having a diameter of 1 mm are formed in the wall of the shower nozzle 11 whose distal end is closed.

A cooled water channel 15 for flowing cooled water is formed in the manifold flange 2 along the sealing portion of the O ring 4. Similarly, a cooled water channel 16 for flowing cooled water is formed in the manifold 3 along the sealing portion of the O ring 5. A heater 17 for heating the inside of the reaction tube 1 is disposed surrounding the tube 1.

A $ClF_3$ gas bomb 30 and an $N_2$ gas bomb 31 are installed for the supply of cleaning gas. Gases supplied from the gas bombs 30 and 31 are fed via depressurizing valves V REG, valves V, and mass flow controllers MFC to a junction point 32 whereat they are mixed together. Cleaning gas which is a mixed gas of $ClF_3$ and $N_2$ is fed via a valve 33 to a branch point 34 from which the cleaning gas is distributed to pipes 35, 36, and 37.

The pipe 35 is coupled to the exhaust pipe 20 at the position more upstream than the hot valve 21, allowing the cleaning gas to be guided to the exhaust pipe 20 without being introduced into the reaction tube 1. This arrangement allows to remove substances such as polycrystalline silicon attached to the inner wall of the exhaust pipe 20. The cleaning effect can be enhanced by heating the exhaust pipe 20 to about 80° C. by the heating pipe 24.

The pipe 36 is coupled to the gas inlet port 10 so as to introduce the cleaning gas into the shower nozzle 11.

A film forming gas bomb 40 containing gas such as silane is coupled via a depressurizing valve 40a, a valve 40c, and a mass flow controller 40b to a junction point 41 to which a pipe 37 is connected via a valve 37c. A gas at the junction point 41 is supplied to a pipe 42. The pipe 42 is coupled to a film forming gas port (not shown) at the manifold flange 2 so as to introduce the film forming gas into the reaction tube 1.

In forming a film on a substrate, the valve 37c is closed and the valve 40c is opened to supply film forming gas to the pipe 42. In cleaning, the valve 40c is closed and the valve 37c is opened to supply cleaning gas to the film forming gas supply system such as the pipe 42, so that a film attached to the inner wall of the film forming gas supply system can be removed. Thereafter, the valves are switched to supply the cleaning gas to the gas inlet port 10 of the reaction tube 1 and to the exhaust pipe 20.

The shower nozzle 11 allows approximately a desired amount of gas to be supplied uniformly over the whole region from the upstream to downstream regions in the reaction tube 1. The inner wall of the reaction tube 1 can therefore be cleaned substantially uniformly. A difference between $ClF_3$ gas concentrations at the upstream and downstream regions is small and a difference between etching rates is small so that damages to the inner wall of the reaction tube 1 at the upstream region can be suppressed.

The sealing portions of the O rings 4 and 5 are maintained to be about 50° C. or lower by flowing cooled water to the cooling water channels 15 and 16. By cooling the sealing portions, damages to the sealing portions by the cleaning gas can be suppressed.

A polycrystalline silicon film having a thickness of 5 μm attached to the inner wall of the reaction tube 1 was cleaned by cleaning gas having a $ClF_3$ concentration of 5% at the reaction tube temperature of 620° C. and at a pressure of 240 Pa. It took about 30 minutes to completely remove the polycrystalline silicon film. In contrast with this, it took 50 minutes to remove the polycrystalline film under the same conditions by directly introducing the cleaning gas via the gas inlet port 10 without using the shower nozzle 11. Use of the shower nozzle 11 can shorten the cleaning time.

Figure 2A:
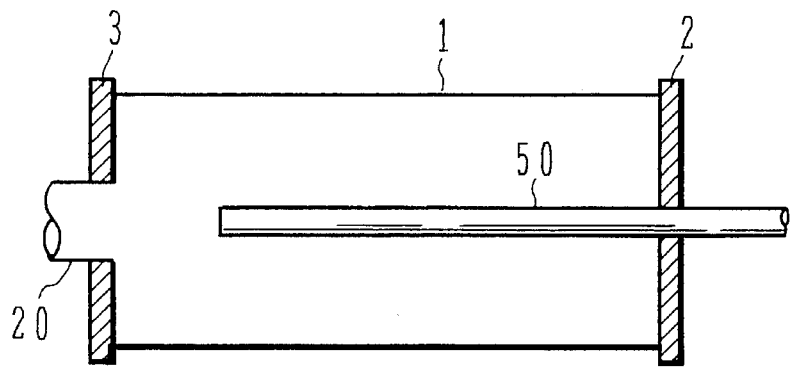
FIG. 2A is a schematic cross sectional view of a CVD system of a modification of the first embodiment.

A modification of the first embodiment will be described with reference to FIGS. 2A to 2C. A reaction tube 1 of a CVD system, manifold flanges 2 and 3, and an exhaust pipe 20 shown in FIG. 2A are similar in structure to those shown in FIG. 1. Cooling channels, O rings, and other elements are omitted in FIG. 2A.

A tubular shower nozzle 50 coupled to the manifold flange 2 generally at its center area is inserted into the reaction tube 1. The tip of the shower nozzle 50 is positioned near at the exhaust side flange 3. In contrast with the shower nozzle 11 disposed along the inner wall of the reaction tube as shown in FIG. 1, the shower nozzle 50 of this modification is disposed generally along the central axis of the reaction tube 1.

In forming a film, the shower nozzle 50 is dismounted, and only for cleaning, it is mounted. Cleaning gas is supplied to the inside of the shower nozzle via a gas supply system similar to that shown in FIG. 1.

Figure 2B:
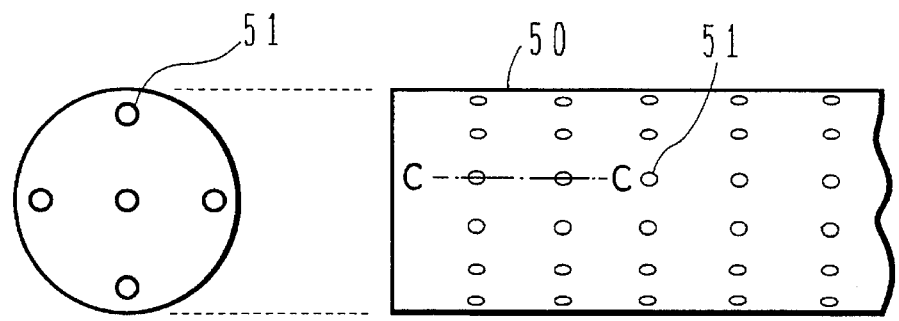
FIG. 2B shows a front view and a side view of a shower nozzle.

FIG. 2B shows a front view and a side view of the tip of the shower nozzle 50. A number of gas jet holes 51 are formed in the side wall and front wall of the shower nozzle 50. Cleaning gas introduced into the shower nozzle 50 is jetted out of a number of gas jet holes 51 and supplied generally uniformly over the whole region in the reaction tube 1.

With this arrangement that the shower nozzle 50 is disposed along the central axis of the reaction tube, generally the same effects as the embodiment shown in FIG. 1 can be obtained.

Figure 2C:
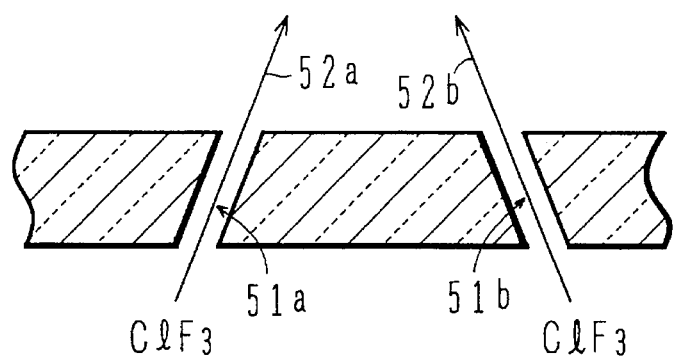
FIG. 2C is an enlarged cross sectional view of gas jet holes of the shower nozzle.

FIG. 2C is a cross sectional view of the shower nozzle 50 taken along a one-dot-chain line C—C of FIG. 2B. The central axis of each gas jet hole 51 is on a plane passing through the central axis of the shower nozzle 50, and is inclined from the latter axis by a predetermined angle. Two adjacent gas jet holes 51a and 51b in the direction of the central axis of the shower nozzle 50 are inclined toward each other so that gas flows 52a and 52b jetted out of the holes collide with each other. For example, the central axis of the gas jet hole 51 may be inclined by 60° C. from the central axis of the shower nozzle 50.

When the gas flows 52a and 52b collide with each other, turbulent flows are generated so that gas can be introduced more uniformly in the reaction tube 1. For example, if the flow rate of $ClF_3$ is set to 250 sccm and the flow rate of $N_2$ is set to 5000 sccm, effective cleaning can be realized under the conditions that the diameter of the shower nozzle 50 is about 6.4 mm, the diameter of the gas jet hole 51 is about 1.3 mm, the interval between gas jet holes is about 5 cm in the direction of the central axis of the shower nozzle 50, the number of gas jet holes in the plane perpendicular to the central axis is 4, and the length of the shower nozzle 50 is 180 cm.

The second embodiment of the invention will be described with reference to FIG. 3.

A reaction tube 1, manifold flanges 2 and 3, an exhaust pipe 20, and O rings 15 and 16 are similar in structure to the CVD system shown in FIG. 1. The gas supply system from a $ClF_3$ gas bomb 30 and an $N_2$ gas bomb 31 to a junction point 34 is similar to the gas supply system shown in FIG. 1, and a mixed cleaning gas of $ClF_3$ and $N_2$ is supplied to the junction point 34.

A pipe 58 branched from the junction point 34 is coupled to the input side of a block valve 59 whose output side is coupled to pipes 60a to 60c. Cleaning gas can be supplied interchangeably to these pipes 60a to 60c time sequentially.

The pipe 60a is connected to a gas inlet port 61a provided at the side wall of the manifold flange 2. The pipe 60b communicates with a through hole 61b formed in the side wall of the reaction tube 1 generally at the central area thereof in the longitudinal direction. The pipe 60c is coupled to the flange 3 and inserted into the reaction tube 1, an outlet 61c of the pipe 60c being positioned near at the flange 3.

By using these three gas inlet ports, cleaning gas can be introduced into the reaction tube 1 via the pipes 60a to 60c interchangeably in time sequence.

For example, cleaning gas is first introduced from the gas inlet port 61a. The $ClF_3$ concentration and the etching rate of an attached film are high at the region near the gas inlet port. After the film attached to the right area from the center of the reaction tube 1 is fully etched, the supply of the cleaning gas from the gas inlet port 61a is stopped.

Next, the cleaning gas is introduced into the reaction tube 1 via the pipe 60b and the through hole 61b. The cleaning gas introduced from the through hole 61b removes the film left at the left side half of the reaction tube. In this case, the cleaning gas is scarcely supplied to the right side half of the reaction tube 1. It is therefore possible to prevent the exposed quartz of the reaction tube 1 at the right side half from being excessively etched.

After the film at the left side half of the reaction tube 1 is fully etched, the supply of the cleaning gas from the through hole 61b is stopped.

Next, the cleaning gas is introduced into the reaction tube 1 via the tip 61c of the pipe 60c. The cleaning gas introduced from the tip 61c can remove the film left on the left side end portion of the reaction tube 1 and on the gas exhaust system.

In this embodiment, the cleaning gas is time sequentially introduced via the three gas inlet ports at the reaction tube 1. The gas may be introduced via two or more gas inlet ports. By time sequentially introducing gas from a plurality of pipes, damages to the inner wall of the reaction tube can be suppressed.

The third embodiment of the invention will be described with reference to FIG. 4. A reaction tube 1, manifold flanges 2 and 3, a cap 6, an exhaust pipe 20, and a heater 17 are similar in structure to the CVD system shown in FIG. 1. The heater 17 is connected to a controller 80 in order to control the temperature of gas in the reaction tube 1.

A film forming gas bomb 71 containing gas such as desilane, a dilution $N_2$ gas bomb 72, and a cleaning $ClF_3$ gas bomb 73 are coupled respectively via depressurizing valves 71a, 72a, and 73a, valves 71b, 72b, and 73b, mass flow controllers 71c, 72c, and 73c, and valves 71d, 72d, and 73d, to a junction point 77. By opening the valves 71b, 72b, and 73b, the film forming gas, $N_2$ gas, or $ClF_3$ gas respectively of a predetermined amount is supplied to the junction point 77.

An $N_2$ gas bomb 74 supplies $N_2$ gas into a vessel 75 via a depressurizing valve 74a. Methanol 76 is contained in the vessel 75. $N_2$ gas supplied to the vessel 75 contains methanol vapor and supplied via a valve 74b, a mass flow controller 74c, and a valve 74d to the junction point 77.

Gas at the junction point 77 is introduced into the reaction tube 1 via a pipe 78 and a gas inlet port 70 provided at the side wall of the manifold flange 2. The gas introduced into the reaction tube 1 is exhausted via an exhaust pipe 20.

In forming a film on a substrate, the valves 72b, 73b, and 74b are closed and the valve 71b is opened to introduce film forming gas into the reaction tube 1. In cleaning, the valve 71b is closed and the valves 72b, 73b, and 74b are opened to introduce a predetermined amount of gas into the reaction tube 1. The mass flow controllers 71c, 72c, 73c, and 74c are controlled by the controller 79 to set a desired amount of gas.

Figure 6:
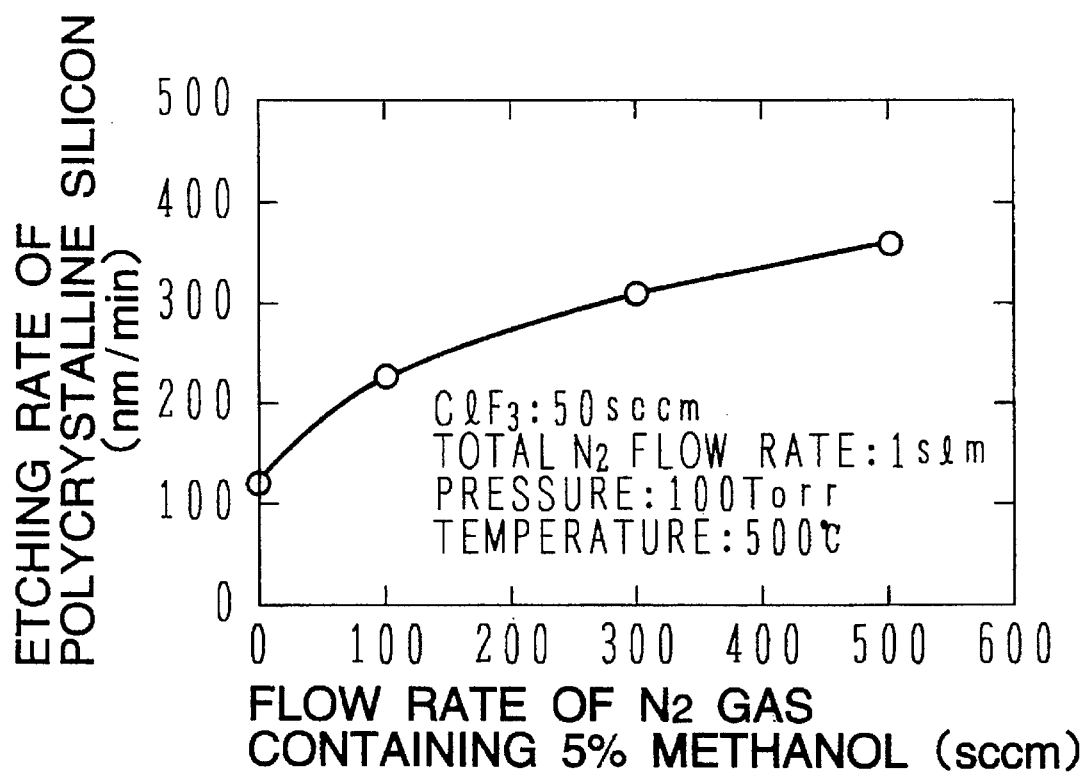
FIG. 6 is a graph showing an etching rate of a polycrystalline silicon film relative to a gas flow rate of $N_2$ containing methanol, according to the third embodiment.

FIG. 6 is a graph showing an etching rate of polycrystalline silicon relative to a flow rate of $N_2$ gas containing methanol, under the conditions that a pressure in the reaction tube is 13.3 kPa (100 Torr), the temperature is 500° C., a $ClF_3$ gas flow rate is 50 sccm, and the total $N_2$ gas flow rate of 1 slm. The abscissa represents a flow rate of $N_2$ gas containing 5% methanol in the sccm unit, and the ordinate represents an etching rate of polycrystalline silicon in the nm unit.

The etching rate without flowing methanol is about 110 nm/min. As the flow rate of methanol is increased, the etching rate increases. At the gas flow of $N_2$ containing 5% methanol, the etching rate is about 350 nm/min.

The reason why the etching rate increases as methanol is added is presumed as in the following.

A reaction of etching silicon by $ClF_3$ progresses generally by the following reaction equations.

$$ClF_3 \rightarrow ClF + F_2$$

$$Si + 2F_2 \rightarrow SiF_4 \uparrow$$

However, a decomposition reaction of $ClF_3$ is difficult at a low temperature.

With an addition of a small amount of methanol for cleaning, the following fluoridization reaction progresses.

$$3CH_3OH + 4ClF_3 \rightarrow 3CF_4 + 4HCl + 3H_2O + H_2$$

This reaction is an exothermic reaction so that the reaction heat intensifies the decomposition reaction of $ClF_3$. The supply of $F_2$ necessary for etching silicon therefore increases and the etching rate increases correspondingly.

By adding a small amount of methanol to a mixed gas $ClF_3/N_2$, it is possible to raise the etching rate of polycrystalline silicon. With an increased etching rate, the cleaning time at a CVD system can be shortened. The amount of methanol to be added is preferably 0.1 to 50% of $ClF_3$.

Addition of methanol to cleaning gas increases also the etching rate of quartz. Accordingly, if a reaction tube made of quartz is used, it is preferable that after an attached film is removed by a certain amount, the gas flow rate is controlled by the mass flow controller 74c controlled by the controller 79 so as to reduce the amount of alcohol or stop the supply of alcohol.

In the above embodiment, methanol is added to cleaning gas. Other alcohol capable of generating exothermic heat by a fluoridization reaction, such as ethanol, may be used. It is however preferable to use alcohol having the number of carbon atoms equal to five or less. $ClF_3$ cleaning gas containing alcohol may be used in the first and second embodiments.

Figure 4:
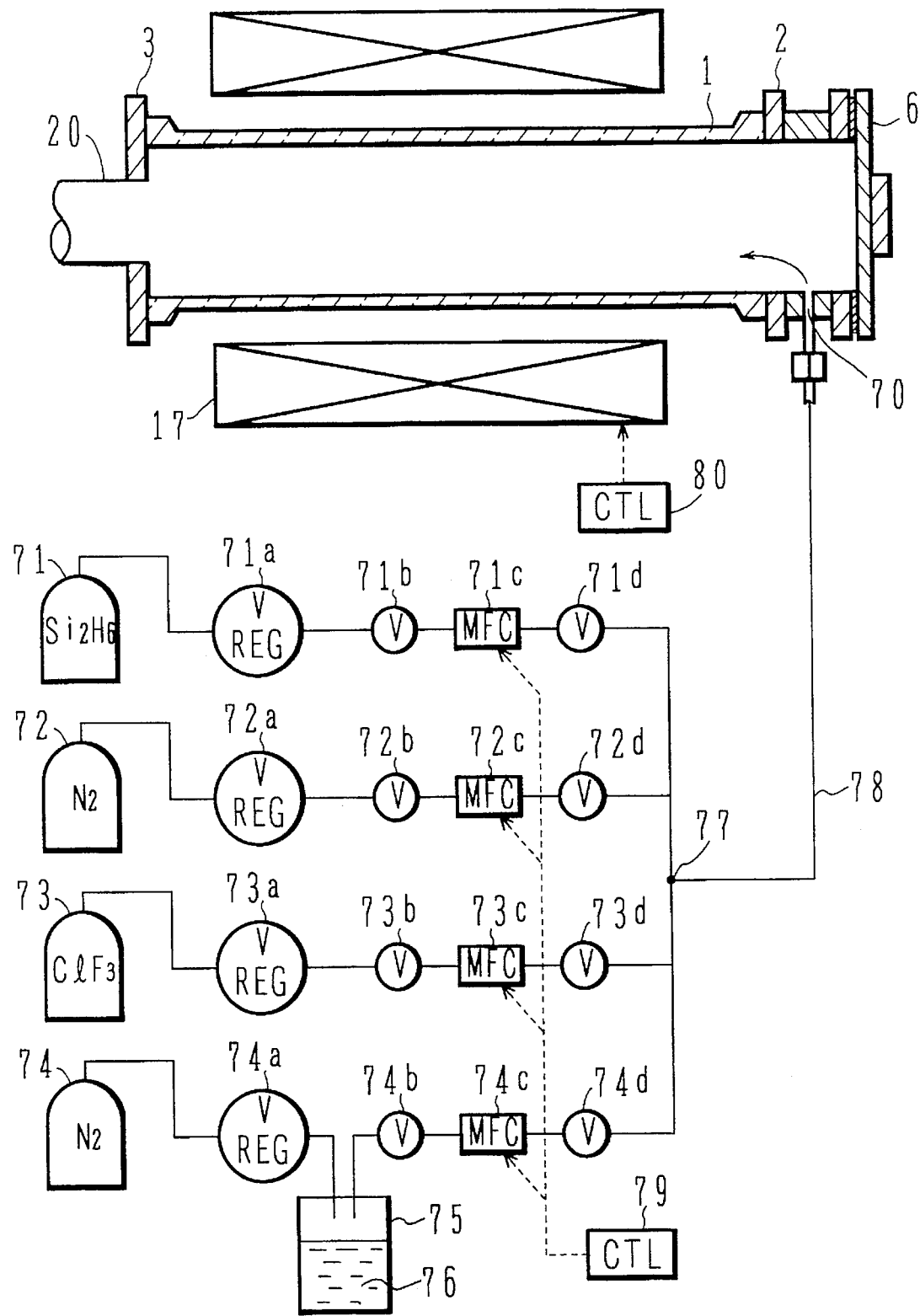
FIG. 4 is a schematic cross sectional view of a CVD system with a gas supply system given in block, according to a third embodiment of the invention.

In the third embodiment shown in FIG. 4, a lateral type CVD system is used. A vertical single-wafer processing type CVD system may also be used with similar expected effects. Furthermore, in the third embodiment, a film to be removed is a polycrystalline silicon film attached to the inner wall of a reaction tube. An SiN film may be used as a film to be removed, with similar expected effects.

A modification of the third embodiment of the invention will be described with reference to FIG. 5.

Figure 5:
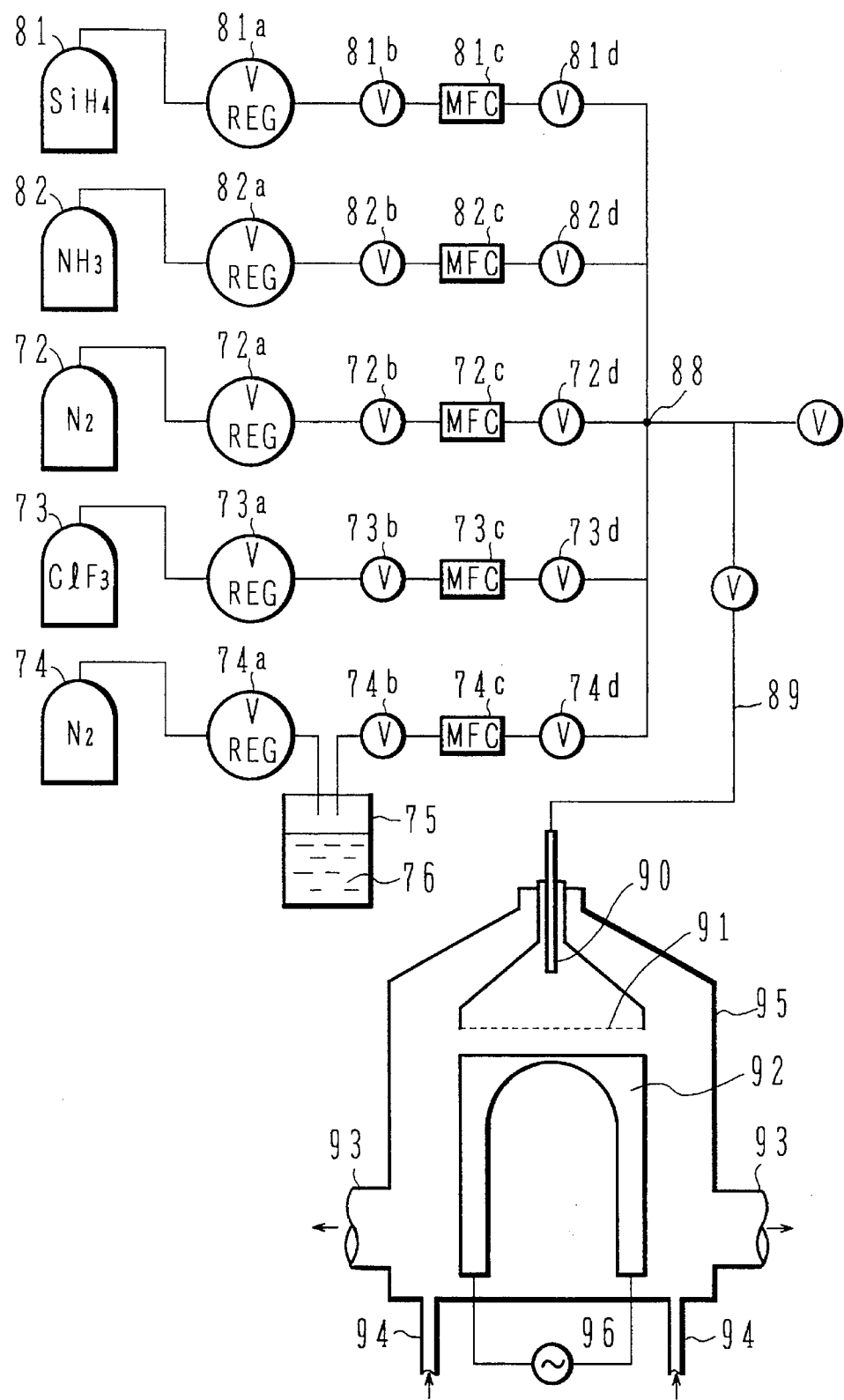
FIG. 5 is a schematic cross sectional view of a CVD system with a gas supply system given in block, showing a modification of the third embodiment.

FIG. 5 is a schematic cross sectional view of a vertical single-wafer processing type CVD system with a gas supply system for forming an SiN film given in block.

A gas inlet port 90 is surrounded by a perforated plate 91. Gas introduced from the gas inlet port 90 is supplied to a reaction chamber 95 via a number of holes formed in the perforated plate 91.

At the counter position of the perforated plate 91, a support base 92 for placing a substrate to be processed, is disposed. This support base 92 is made of carbon coated with SiC, and is connected to a power source 96 to provide also a heater function.

Exhaust pipes 93 are coupled to the reaction chamber 95 at lower side walls thereof to exhaust gas in the chamber. Gas inlet ports 94 for supplying cleaning gas are coupled to the bottom of the reaction chamber 95.

The gas supply system for supplying dilution $N_2$ gas, cleaning $ClF_3$ gas, and $N_2$ gas containing methanol is similar in structure to that shown in FIG. 4. Each gas is supplied to a junction point 88.

A film forming $SiH_4$ gas bomb 81 and an $NH_3$ gas bomb 82 are coupled respectively via depressurizing valves 81a and 82a, valves 81b and 82b, mass flow controllers 81c and 82c, and valves 81d and 82d, to a junction point 88 which is coupled via a pipe 89 to a gas inlet port 90.

In forming a film on a substrate, the valves 72b, 73b, and 74b are closed and the valves 81b and 82b are opened to introduce $SiH_4$ gas and $NH_3$ gas of a predetermined amount into the reaction chamber 95 and to deposit an SiN film on a substrate.

In cleaning, the valves 81b and 82b are closed and the valves 72b, 73b, and 74b are opened to introduce cleaning gas into the reaction chamber 95. Addition of methanol to $ClF_3$ is expected to present similar effects to the third embodiment shown in FIG. 4.

Figure 3:
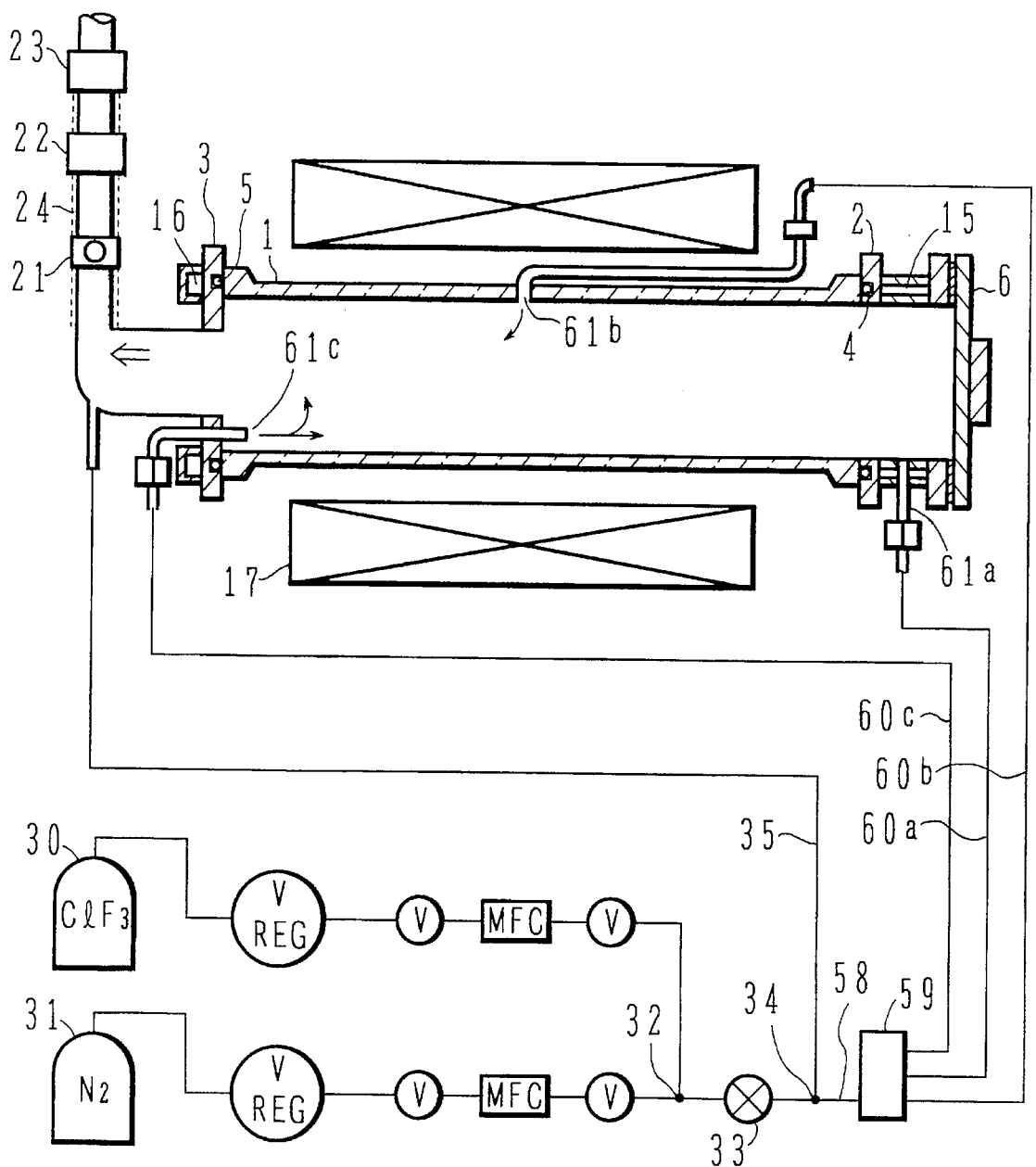
FIG. 3 is a schematic cross sectional view of a CVD system with a gas supply system given in block, according to a second embodiment of the invention.

Time sequential introduction of cleaning gas from the gas inlet ports 94 at the bottom of the reaction chamber 95 is also expected to present similar effects to the third embodiment shown in FIG. 3.

The fourth embodiment of the invention will be described with reference to FIGS. 7A and 7B.

The CVD system shown in FIG. 4 is used to introduce a mixed gas of $ClF_3/N_2$ into the reaction tube 1 by closing the valves 71b and 74b and opening the valves 72b and 73b. The reaction temperature is 620° C., and the reaction pressure is 240 Pa (1.8 Torr). In this embodiment, the reaction tube 1 is made of quartz.

Figure 7A:
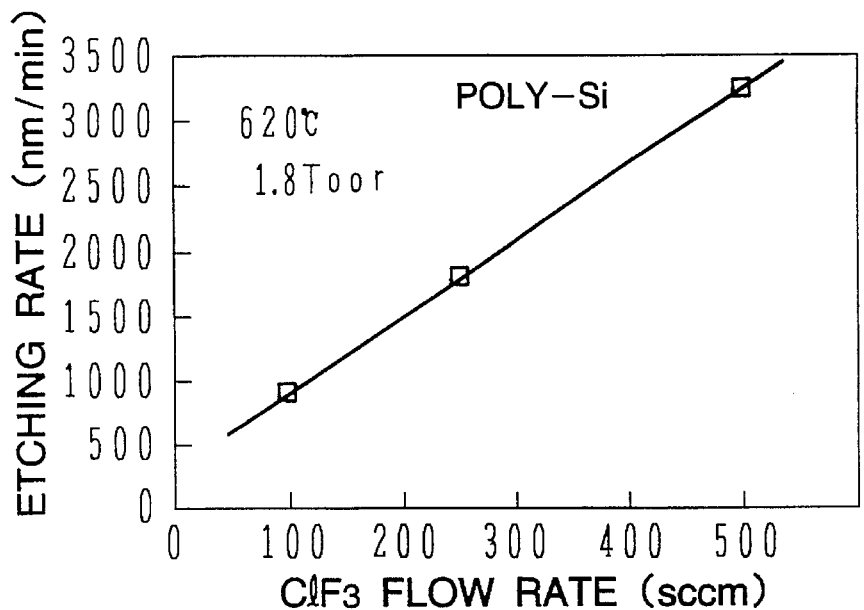
FIG. 7A is a graph showing an etching rate of a polycrystalline silicon film relative to a gas flow rate of $ClF_3$, according to the fourth embodiment.
Figure 7B:
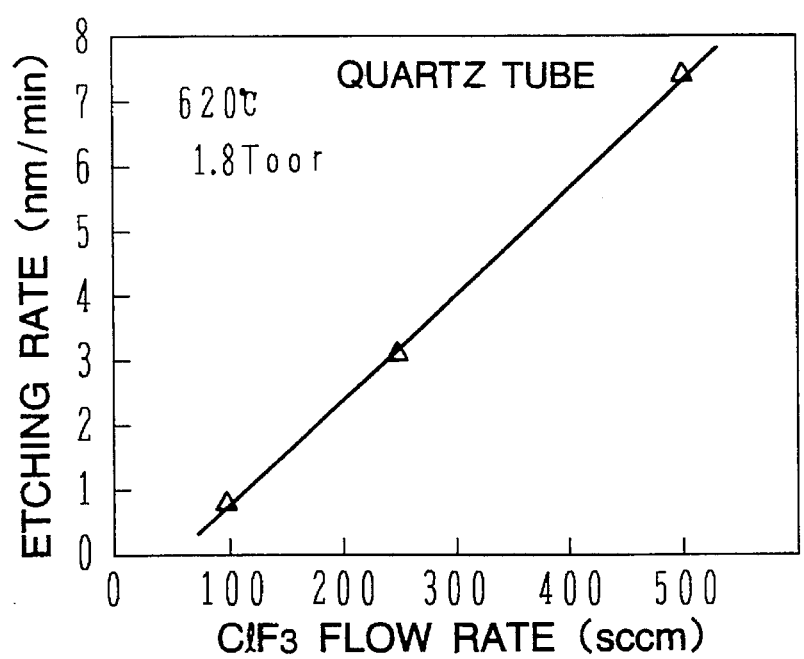
FIG. 7B is a graph showing an etching rate of quartz under the same conditions.
Figure 8A:
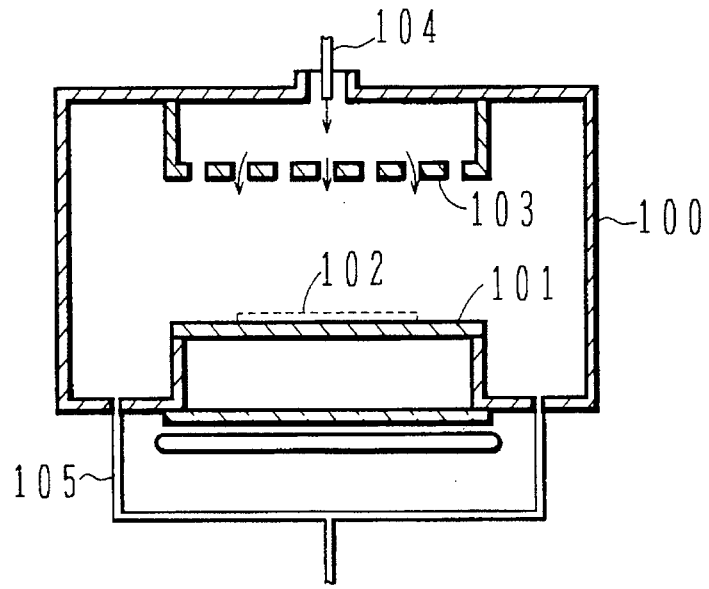
FIGS. 8A and 8B are schematic cross sectional views of conventional CVD systems.
Figure 8B:
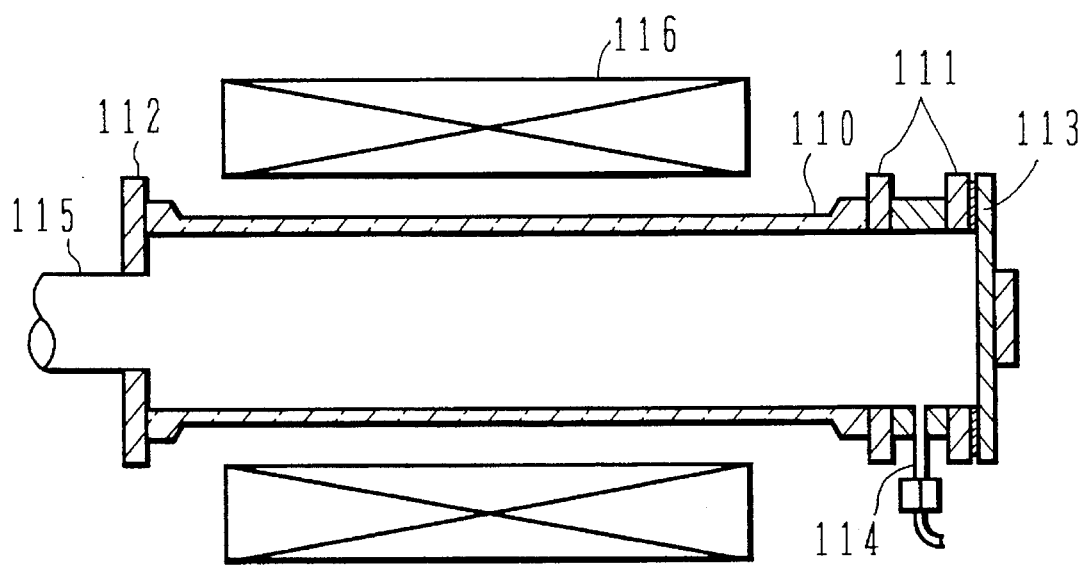

FIGS. 7A and 7B are graphs showing the etching rates of a polycrystalline film and a quartz of the reaction tube 1 relative to a flow rate of $ClF_3$ under the above-described conditions. The abscissa represents a flow rate of $ClF_3$ gas in the sccm unit, and the ordinate represents an etching rate in the nm/min unit.

As shown in FIG. 7A, at the $ClF_3$ gas flow of 500 sccm, the etching rate of a polycrystalline film is about 3.3 µm/min. As the $ClF_3$ gas flow rate is reduced, the etching rate reduces. As the $ClF_3$ gas flow rate is reduced to 100 sccm, the etching rate becomes about 0.9 µm/min which is about ⅓ of the etching rate at the $ClF_3$ gas flow rate of 500 sccm.

As shown in FIG. 7B, at the $ClF_3$ gas flow of 500 sccm, the etching rate of quartz is about 7.5 nm/min. As the $ClF_3$ gas flow rate is reduced, the etching rate reduces similar to the polycrystalline silicon film. As the $ClF_3$ gas flow rate is reduced to 100 sccm, the etching rate becomes about 0.7 nm/min which is about ⅒ of the etching rate at the $ClF_3$ gas flow rate of 500 sccm.

Therefore, the etching ratio of polycrystalline silicon to quartz is about 440 at the $ClF_3$ gas flow rate of 500 sccm, whereat it increases to 1300 at the $ClF_3$ gas flow rate of 100 sccm.

Generally, the etching rate of a film attached to the inner surface of a reaction tube is not uniform. Accordingly, if cleaning is performed at a $ClF_3$ gas flow rate of about 500 sccm, quartz is etched at the area at which a high etching rate of polycrystalline film occurs. After cleaning is repeated, the transparency of a quartz tube is lost. At the $ClF_3$ gas flow rate of 250 sccm or lower, however, the etching rate of quartz lowers and the etching ratio of quartz to polycrystalline silicon increases. Therefore, the quartz surface is hardly etched, without loosing the transparency even if cleaning is repeated.

If a polycrystalline silicon film is uniformly etched to the whole inner wall of a reaction tube, it is preferable to increase the $ClF_3$ gas flow rate and raise the etching speed.

More in particular, at the initial stage of cleaning, an etching rate of an attached film is raised by controlling the mass flow controllers 73c and 72c by the controller 79 to change the flow rates. As the thickness of the film becomes thin, the etching ratio of the attached film and material of the reaction tube is increased by controlling the mass flow controllers 73c and 72c by the controller 79 to change the flow rates. By changing the gas flow rates by the mass flow controllers 73c and 72c at the initial and final stages of cleaning, damages to the reaction tube can be reduced, preventing a cleaning time from being prolonged.

The first and second embodiments may be combined to first remove most of a film attached to the surface of a reaction tube and then remove the residual film by reducing the $ClF_3$ flow rate.

In the above embodiment, a polycrystalline silicon film attached to a quartz surface is removed by cleaning. An attached SiN film may also be removed with similar expected effects.

In the above embodiment, an etching rate is controlled by changing the flow ratio of $ClF_3$ to $N_2$. Similar effects can also be obtained by controlling an amount of alcohol to be added, the pressure of cleaning gas in a reaction tube, and a partial pressure ratio of $ClF_3$ to $N_2$. Furthermore, an etching speed and ratio may be controlled by changing the temperature of a mixed gas of $Cl_3/N_2$ at the initial and final stages of cleaning by controlling the heater 17 by the controller 80.

The cleaning mechanics of $ClF_3$ have not clarified completely as yet. But, exact etching rate is not of great concern because this is an off-line tube cleaning process and has no effect on wafers. The present inventors have studied some characteristics of $ClF_3$ cleaning by using a lateral type low pressure CVD system presently used widely. There are a lateral manifold type low pressure CVD furnace whose gas supply flanges constitute a manifold gas supply system and a lateral cap type low pressure CVD furnace whose through pipes constitute a gas supply system. A difference between both the types is how gas is supplied to the reaction tube. Typical materials of a thin film to be deposited include silicon based materials such as polycrystalline silicon and amorphous silicon and $Si_3N_4$.

Assuming that a quartz reaction tube is used, typical materials to be etched by cleaning include silicon, SiN ($Si_3N_4$ and other compounds with different stoichiometric compositions), and $SiO_2$. The important case is that polycrystalline silicon is deposited on a substrate placed in a quartz reaction tube and thereafter polycrystalline silicon attached to the tube is cleansed. As described earlier, polycrystalline silicon deposited on the quartz reaction tube is cleaned by $ClF_3$ gas and removed starting from the upstream of the gas flow. The influence of the etched and exposed surfaces of the quartz tube and jigs by the cleaning gas becomes a main issue.

The present inventors checked the etching rates of polycrystalline silicon, $Si_3N_4$, and $SiO_2$ thin films, by placing wafers deposited with these thin films thereon in a conventional lateral manifold type low pressure CVD furnace whose quartz tube and jigs are not initially formed with thin films, by etching the thin films by $ClF_3$ gas, and by measuring the thicknesses of the etched thin films.

Polycrystalline silicon cleaning is performed, for example, at a temperature of about 620° C. At this temperature, the etch rates of polycrystalline silicon, $Si_3N_4$, and $SiO_2$ differ greatly. For example, under a flow rate of 5.25 slm of a mixed gas of $ClF_3$: $N_2$=1:20 and at a temperature of about 620° C., the etch ratio of polycrystalline silicon to $SiO_2$ has a value of about three digits, the etch ratio of $Si_3N_4$ to $SiO_2$ has a value of about two digits, and the etch ratio of tungsten and tungsten silicide to $SiO_2$ is in the same order as that of polycrystalline to $SiO_2$.

Figure 9A:
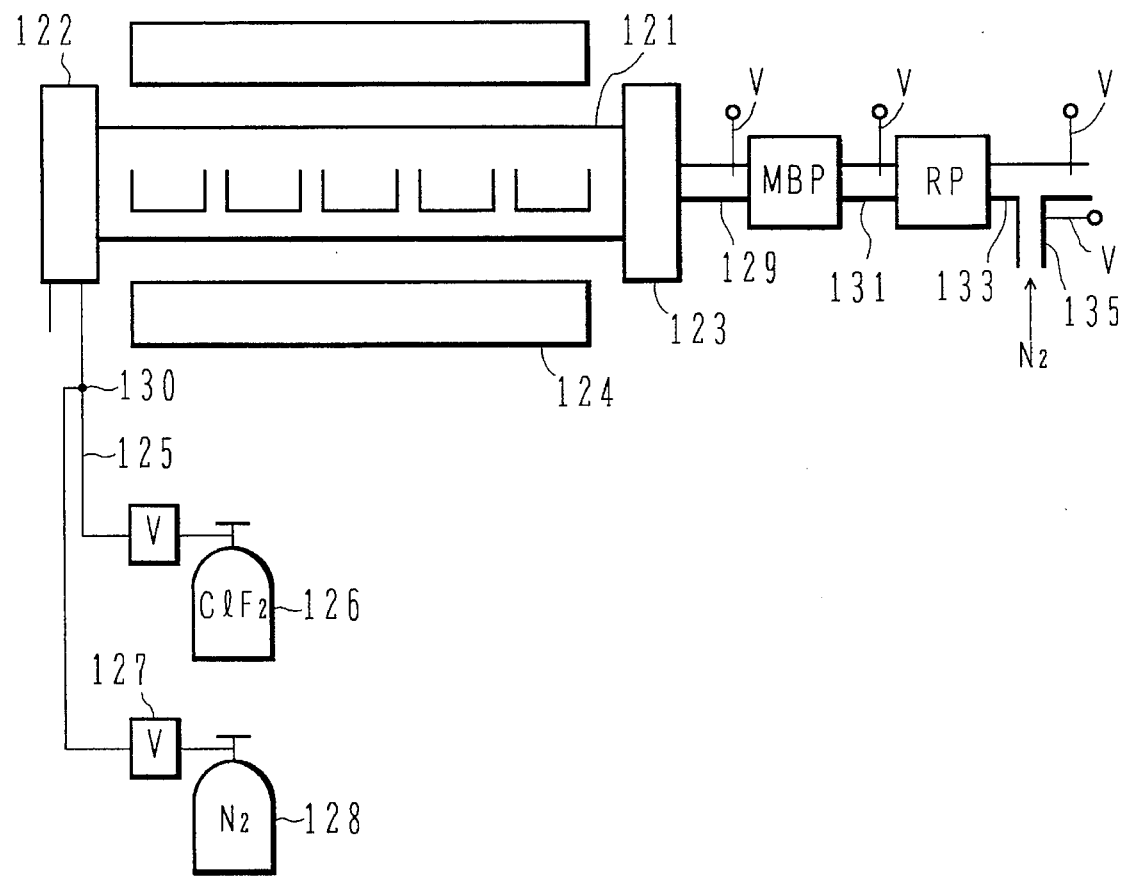
FIG. 9A is a schematic diagram showing the structure of the lateral manifold type CVD furnace used by the experiments.

FIG. 9A is a schematic diagram showing the structure of the lateral manifold type CVD furnace used by the experiments. One end of a quartz reaction tube 121 is coupled to a manifold flange 122, and the other end thereof is coupled to a flange 123 having an exhaust duct 129. The manifold flange 122 is connected to a cleaning gas line and forming gas line. The cleaning gas line is comprised of a $ClF_3$ tube 125, an $N_2$ tube 127, and a junction point whereat they are mixed together. The pipes 125 and 127 are connected via flow regulators V such as conductance valves to a $ClF_3$ source 126 and an $N_2$ source 128, respectively. The exhaust duct 129 is connected to a waste gas processing system via a mechanical booster pump MBP, an intermediate duct 131, and a rotary pump 133. An $N_2$ supply means 135 is provided upstream of the waste gas processing system. Various valves V are also provided on the exhaust gas side.

Five baskets were placed in the reaction tube 121 initially having no deposited film on the inner wall thereof, silicon wafer samples each formed with a polycrystalline silicon film, a silicon nitride film, and a thermally oxidized film were placed in the first basket, and the etch rates were measured. The mixing ratio of $ClF_3$ gas to $N_2$ gas was fixed to 1:20, the total flow rate was changed, and the pressure in the reaction furnace was maintained constant at about 2.05 Torr. The etch rates of the samples were measured by changing the flow rate of $ClF_3/N_2$ (sccm) between 100/2000, 150/3000, 200/4000, and 250/5000. The etch rate of each thin film was normalized by setting the etch rate at the $ClF_3/N_2$ flow rate=250/5000 (sccm) to "1".

Figure 9B:
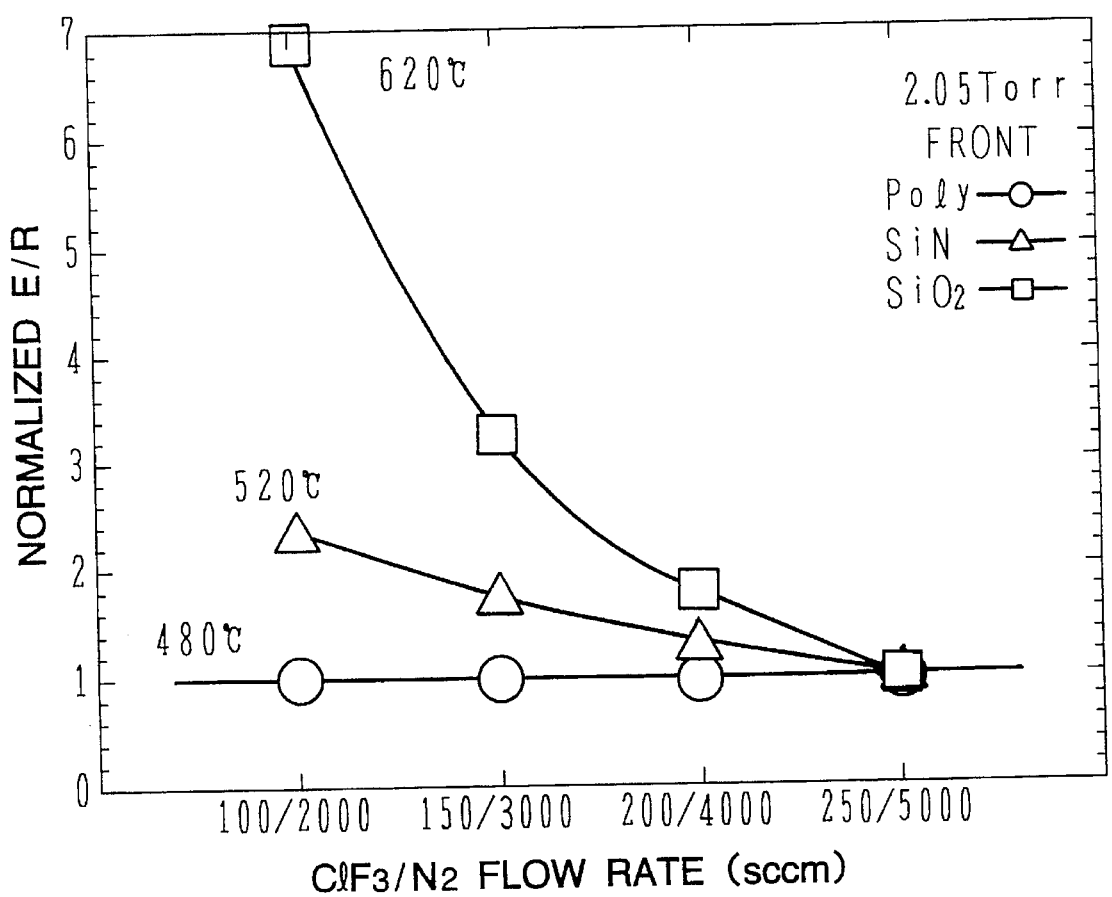
FIG. 9B is a graph showing etch rates of polycrystalline silicon, SiN, and $SiO_2$, relative to a $ClF_3$ flow rate under a constant pressure in a reaction tube.

The measured results are shown in FIG. 9B. The thin films were etched by setting the substrate temperature to 480° C. for polycrystalline silicon, 520° C. or $Si_3N_4$, and 620° C. for $SiO_2$. Under the constant pressure of 2.05 Torr, the etch rate of polycrystalline silicon hardly changed with the $ClF_3/N_2$ flow rate, whereas the etch rate of SiN increased as the flow rate reduced and the etch rate at the flow rate of 250/5000 (sccm) increased by about 2.3 times the etch rate at the flow rate of 100/2000 (sccm).

The increase of the etch rate of $SiO_2$ was greater than SiN as the flow rate reduced. The etch rate at the flow rate 200/5000 (sccm) increased about 7 times the etch rate at the flow rate 100/2000 (sccm).

The amount of $ClF_3$ present at any time in the reaction tube is supposed to be constant because the pressure in the reaction tube was maintained constant and the flow ratio of $ClF_3$ to $N_2$ was maintained constant, although the flow rate was changed. An increase of the etch rate as the flow rate is reduced, does not imply that only fresh gas contributes to etching. The experiments also suggest different etching mechanisms between polycrystalline silicon and $SiO_2$ ($Si_3N_4$).

In order to maintain the pressure in the reaction tube constant, the gas exhaust speed is required to be lowered as the total flow rate of gas supplied to the reaction tube reduces. For example, as the flow rate changes from 250+5000 (sccm) to 100+2000 (sccm), the gas exhaust speed is required to change by ⅖. As the gas exhaust speed lowers, an average time required for exhausting etching gas supplied to the reaction tube, is prolonged. For example, as the gas exhaust speed changes by ⅖, the residence time of $ClF_3$ gas in the reaction furnace increases by 5/2. Assuming that $ClF_3$ gas in the reaction furnace changes its composition (by decomposition or the like) at a constant rate, the concentration of by-products produced by the composition change increases more as the residence time becomes longer.

The measurement results shown in FIG. 9B indicate that the etch rate of $SiO_2$ increases as the residence time of etching gas in the furnace becomes longer. It is therefore more preferable, the shorter the furnace residence time of $ClF_3$ gas becomes, in order to clean polycrystalline silicon or silicon nitride films and in order not to etch $SiO_2$ in the reaction tube as much as possible. From another viewpoint, etching the wall of the reaction furnace can be prevented the higher the gas exhaust speed of the gas exhaust system becomes. Next, the flow rate of $ClF_3$ supplied to the reaction furnace was fixed to 250 sccm and the $N_2$ flow rate was changed, and the etching rates of $SiO_2$ films formed on Si substrates placed in the first and fifth baskets were measured. The $N_2$ flow rate was changed between 0, 1, 5, 10, and 15 (slm), the furnace pressure changed correspondingly to 0.16, 0.51, 2.05, 4.4, and 7.0 Torr.

Figure 10:
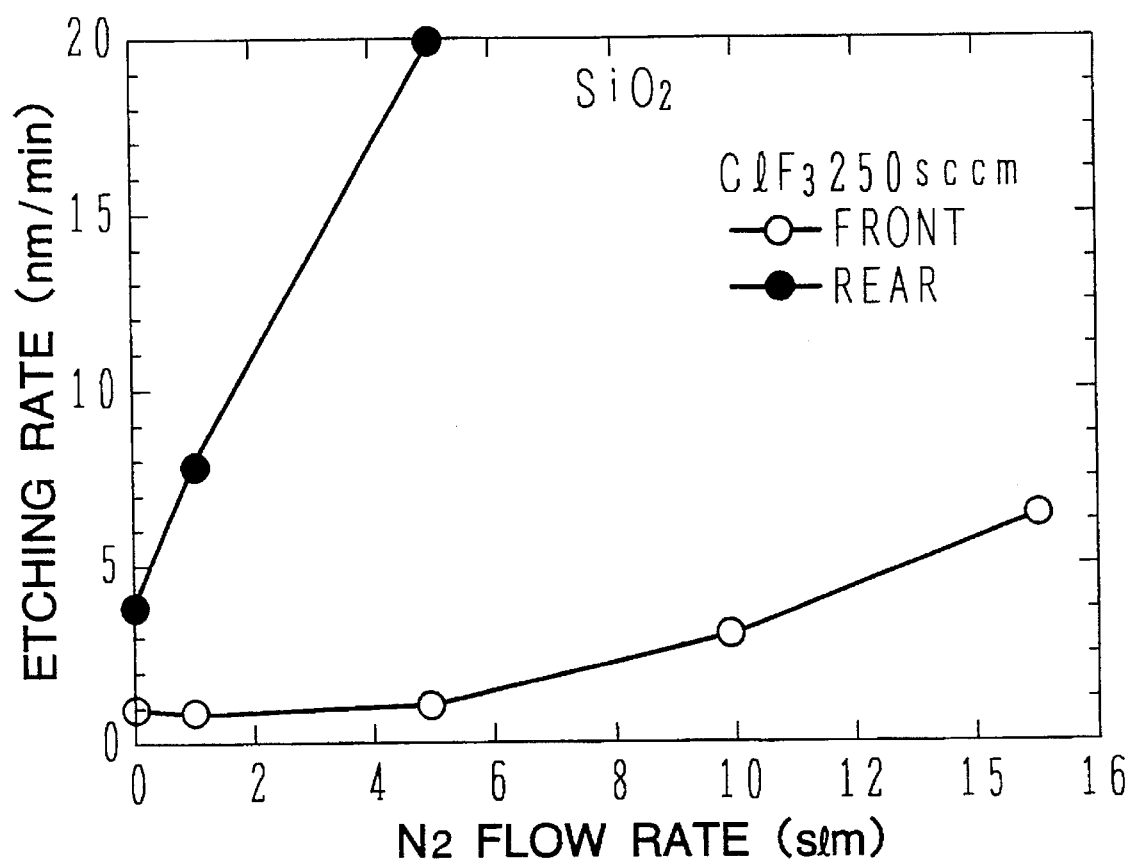
FIG. 10 is a graph showing etch rates on upstream and downstream sides, relative to a mixed $N_2$ flow rate with a constant $ClF_3$ flow rate.

The experiment results of the etch rates of $SiO_2$ films are shown in FIG. 10. The abscissa represents the mixed $N_2$ flow rate (slm) and the ordinate represents the etch rate of an $SiO_2$ film (nm/min).

The etch rate of the sample in the first basket at the upstream (front) position maintains generally constant without being affected by the mixed $N_2$ flow rate until the flow rate reaches 5 slm (furnace pressure 2.05 Torr). However, as the $N_2$ flow rate further increases, the etch rate increases, by about 7 times at the mixed $N_2$ flow rate of 15 slm. It is supposed that as the $N_2$ flow rate (furnace pressure) reaches some level or higher, the compositions contributing to etching increase.

In contrast to the above, the etch rate of the sample in the fifth basket at the downstream (rear) position is about 4 times that at the upstream position, even if $N_2$ is not mixed. The etch rate rapidly increases as the $N_2$ flow rate increases. It is supposed that the composition contributing to etching increases as the cleaning gas flows downstream in the reaction tube.

$ClF_3$ gas is thermally decomposed with ease into ClF molecules and $F_2$ molecules. These molecules are supposed to be further decomposed in the reaction furnace and to produce active species such as F radicals. Therefore, the amount of active species is supposed to be larger at the downstream position than at the upstream position.

Consider the etch ratio of the upstream side to the downstream side, this etch ratio rapidly increases as the $N_2$ flow rate increases. This phenomenon implies that $ClF_3$ supplied to the reaction tube increases active species as it flows in the tube and that the higher the pressure in the tube, the generation factor of active species increases. If there is an exposed $SiO_2$ surface on both the upstream and downstream sides, the $SiO_2$ surface on the downstream side may be etched excessively. For the protection of the reaction tube, it is preferable to reduce the mixed $N_2$ during cleaning as much as possible.

In order to clean a polycrystalline film attached to a reaction tube, it is desired to supply $ClF_3$ gas more than a certain amount. In this case, if $N_2$ gas is mixed, the quartz surface of the reaction tube becomes likely to be etched even on the upstream side as seen from FIG. 9B, and in addition, the $SiO_2$ surface on the downstream side is etched more excessively than that on the upstream side as seen from FIG. 10. It is therefore desired not to supply $N_2$ gas to the reaction tube, or at least to reduce the amount of mixed $N_2$ gas to some level or smaller.

The lateral, manifold gas introducing type CVD furnace has been described above. The etching performance is different more or less in the case of a lateral, cap gas introducing type CVD furnace.

Figure 11A:
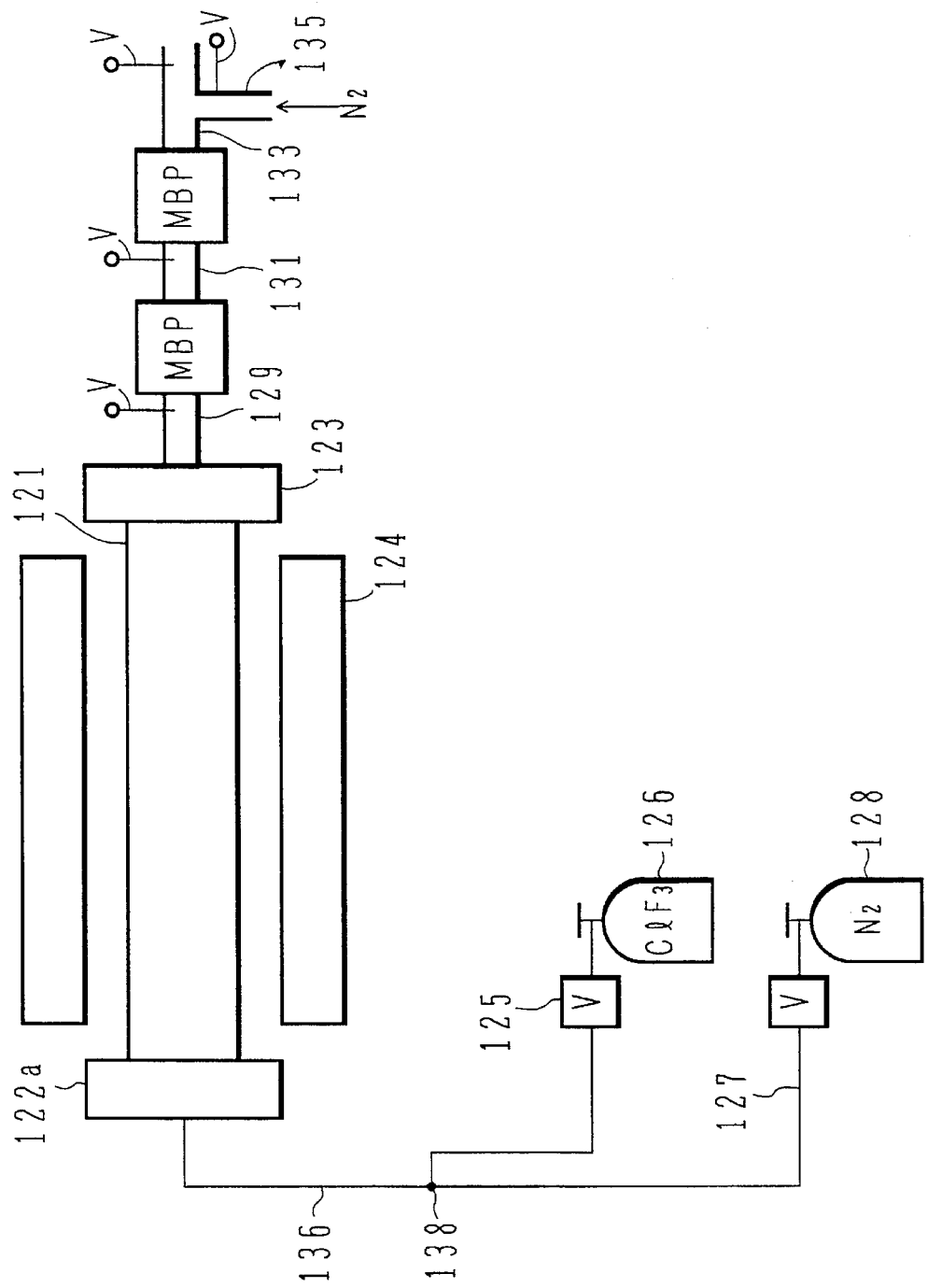
FIG. 11A is a schematic diagram showing the structure of the lateral cap type CVD furnace used by the experiments.

FIG. 11A is a schematic diagram showing the structure of a lateral cap type CVD furnace used by the experiments. The different point from the structure shown in FIG. 9A is a cap type upstream flange 122a of a reaction tube 121, a pipe 136 entering perpendicularly the flange 122a is communicated with gas pipes 125 and 127 via a junction point 138. A vacuum pump on the gas exhaust side is constituted by mechanical booster pumps (MBP). Five baskets are disposed in the reaction tube 121. The first basket was used for the upstream (front) side, the third basket was used for the center-stream (center) side, and the fifth basket was used for the downstream (rear) side. Samples deposited with thin films thereon were placed in baskets and the etch rates thereof were measured.

The etch rates of thin films at the upstream, center-stream, and downstream positions were measured while $ClF_3$ of a constant flow rate was introduced and $N_2$ flow rate was changed.

Figure 11B:
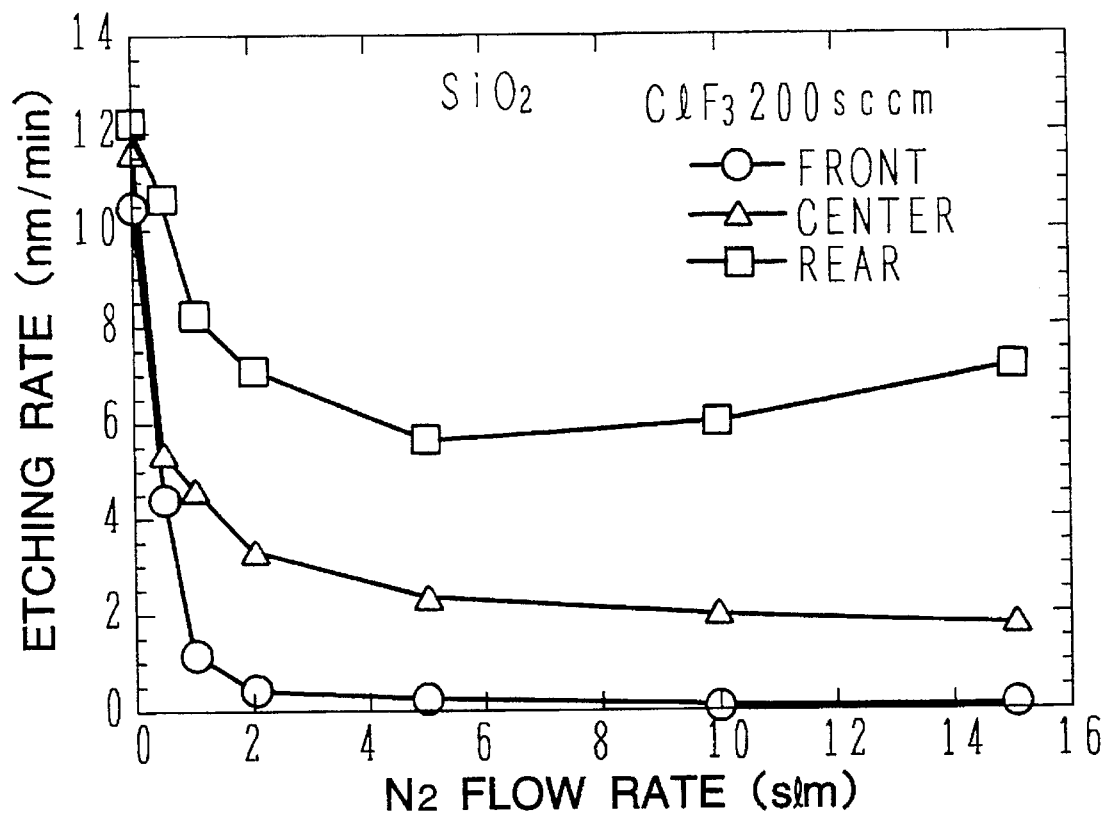
FIG. 11B is a graph showing etch rates of $SiO_2$ at upstream, center-stream, and downstream positions, relative to a mixed $N_2$ flow rate with a constant flow rate of $ClF_3$.

The measurement results are shown in FIG. 11B. The reaction tube 121 was heated by a heater 124 to 620° C., $ClF_3$ gas was introduced at 200 sccm, and $N_2$ was mixed in the range from 0 to 15 slm. The abscissa represents the mixed $N_2$ flow rate (slm) and the ordinate represents the etch rate of an $SiO_2$ film. The distinctive point different from the measurement results shown in FIG. 10 is that when $N_2$ is mixed, the etch rates distinctively reduce at all the upstream, center-stream, and downstream positions.

The etch rate lowers as the mixed $N_2$ flow rate increases, until the mixed $N_2$ flow rate reaches 5 slm. The etch rate of the sample at the upstream position lowers greatly, whereas the etch rate of the sample lowers less at the center-stream and lowers lesser at the downstream position. This phenomenon is supposed to result from that the cleaning gas supplied from the cap flange 122a shown in FIG. 11A directly collides with the sample surface and cools the sample. In general, the etch rate lowers as the temperature lowers. The etch rate therefore lowers as the mixed $N_2$ flow rate increases. The reduction tendency of the etch rates of the samples is similar both at the upstream and center-stream positions, and the etch rate reduction is smaller at the upstream position than the center-stream position and at the center-stream position than the downstream position. This is supposed that the cleaning gas is gradually heated while it flows in the reaction tube.

As the mixed $N_2$ flow rate exceeds 5 slm, the etch rate at the downstream position gradually increases. This tendency is supposed to be the same as described with FIG. 10. That is to say, as the gas pressure rises, active species in the cleaning gas increase to raise the etch rate of $SiO_2$.

The minimum etch rate at the mixed $N_2$ flow rate of 5 slm at the downstream position shown in FIG. 11B was studied further in detail. The $ClF_3$ flow rate was fixed to 200 sccm, and the reaction furnace temperature was set to 620° C. The etch rates of wafers formed with polycrystalline silicon, $Si_3N_4$, and $SiO_2$ thin films placed in the reaction furnace at the upstream, center-stream, and downstream positions were measured. The pressure in the reaction tube was set to 2.05 Torr.

Figure 12:
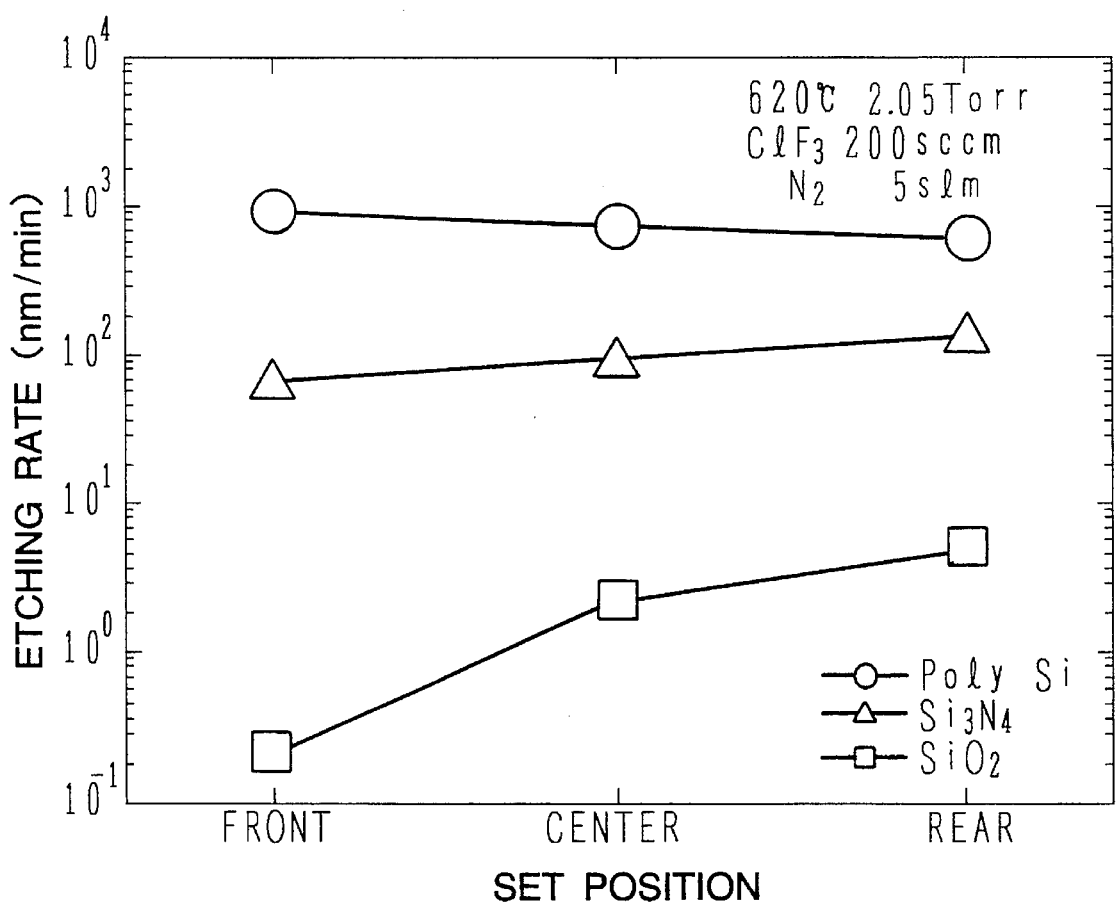
FIG. 12 is a graph showing etch rates of polycrystalline silicon, $Si_3N_4$, and $SiO_2$ at upstream, center-stream, and down-stream positions, at the $N_2$ flow rate of 5 slm.

FIG. 12 shows the measurement results.

The etch rate of polycrystalline silicon lowered toward the downstream (rear) position. This is supposed that compositions contributing to etching are consumed and reduce toward the downstream position.

The etch rate of $SiO_2$, however, increased respectably toward the downstream position of the reaction tube. This is supposed that compositions contributing to etching increase toward the downstream.

The etch rate of $Si_3N_4$ slightly rose toward the downstream. A change in the etch rate of $Si_3N_4$ is supposed to be intermediate between the etch rates of polycrystalline silicon and $SiO_2$.

The temperatures in the reaction tube were measured for the additional parameter of experiments. The upstream position was 578° C., the center-stream position was 613° C., and the downstream position was 634° C. This temperature change is also supposed to contribute to the etch rate change described above.

The positional dependency of the etch rate of polycrystalline silicon is entirely opposite to that of $SiO_2$. It can therefore be hypothesized that the etching mechanisms of polycrystalline silicon and $SiO_2$ are different. The etch rate at the downstream position larger by one digit than at the upstream position becomes a significant factor, when damages of a quartz reaction tube are taken into consideration.

Figure 13:
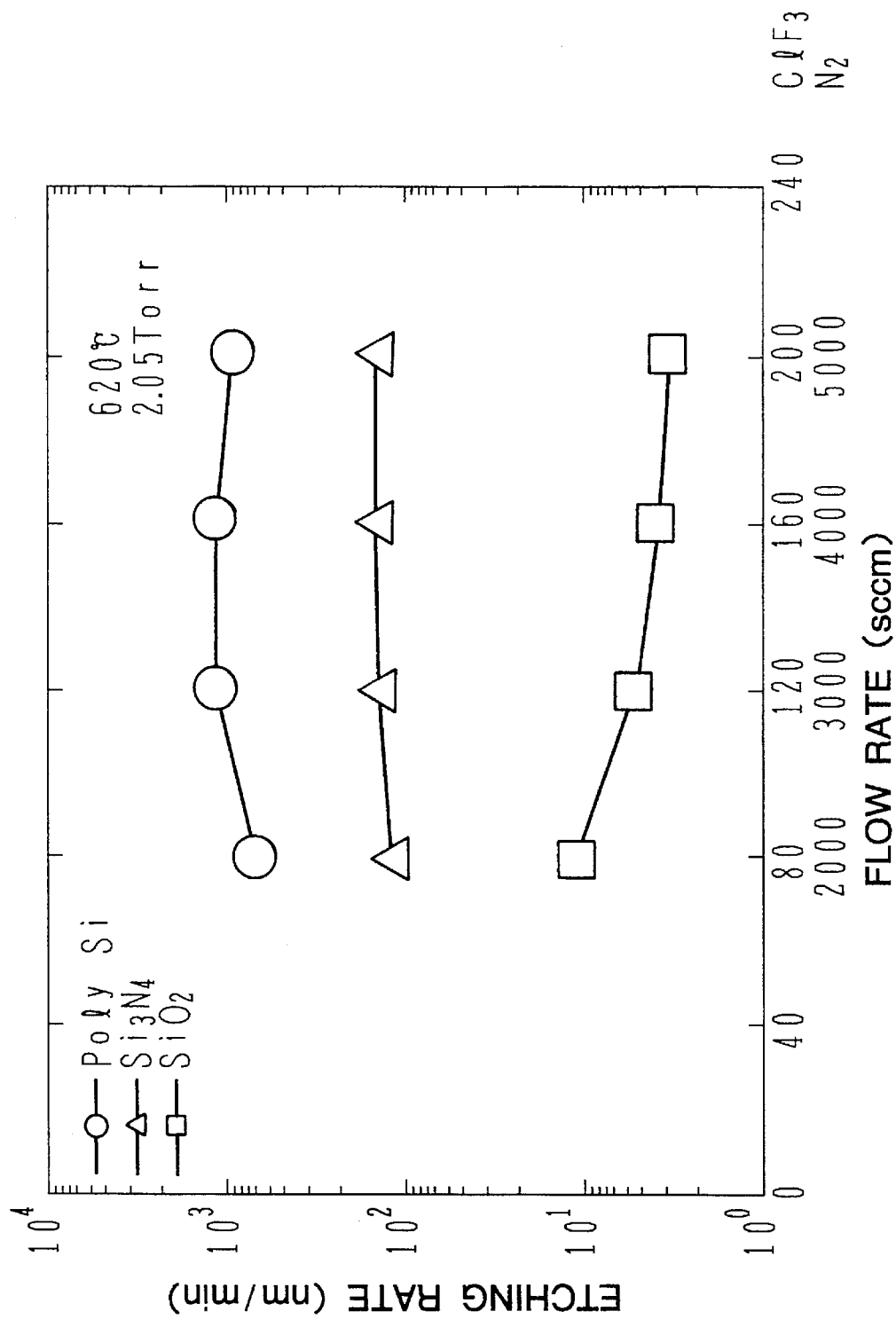
FIG. 13 is a graph showing etch rates of polycrystalline silicon, $Si_3N_4$, and $SiO_2$ at the downstream position, relative to a cleaning gas flow rate under a constant pressure in a reaction tube.

FIG. 13 is a graph showing etch rates measured by maintaining the pressure in the reaction tube constant and changing the cleaning gas flow rate. The reaction tube temperature was set to 620° C., the $ClF_3/N_2$ flow ratio was fixed to 1/25, and the reaction tube pressure was maintained at 2.05 Torr. Samples deposited with polycrystalline silicon, $Si_3N_4$, and $SiO_2$ films were placed in the reaction tube at the downstream position, and the etch rates were measured. The cleaning gas flow rate $ClF_3/N_2$ was changed between 80/2000, 20/3000, 160/4000, and 200/5000. The abscissa represents the cleaning gas flow rate. Since the reaction tube pressure gas was maintained constant at 2.05 Torr, the gas exhaust speed becomes higher and the residence time of the cleaning gas in the reaction tube becomes shorter, respectively toward the right of the abscissa (in the region with a large flow rate). The ordinate represents the etch rate of each film in unit of nm/min.

The etch rate of the $Si_3N_4$ film slightly lowers as the flow rate lowers. The etch rate of polycrystalline silicon is generally constant in the region at the flow rate of 120/3000 (sccm) or higher, and lowers at 80/2000 (sccm). Conversely, the flow rate of the $SiO_2$ film gradually rises as the flow rate lowers. The reason why the etch rate of polycrystalline silicon lowers (at 80/2000 sccm) is supposed that the weight of the etching gas $ClF_3$ reduces, whereas the reason why the etch rate of $SiO_2$ rises as the flow rate lowers, is supposed that active species increase as the residence time becomes long. This tendency is similar to that shown in FIG. 9B associated with the lateral manifold type CVD furnace. In order to lower the etching rate of $SiO_2$, it is preferable to raise the gas exhaust speed of the gas exhaust system and to shorten the residence time of the cleaning gas in the reaction tube.

A change in the etch rate with a reaction tube temperature was checked under the conditions of a constant reaction tube pressure and a constant flow rate. The measurement of the etch rate was performed at the downstream position.

Figure 14A:
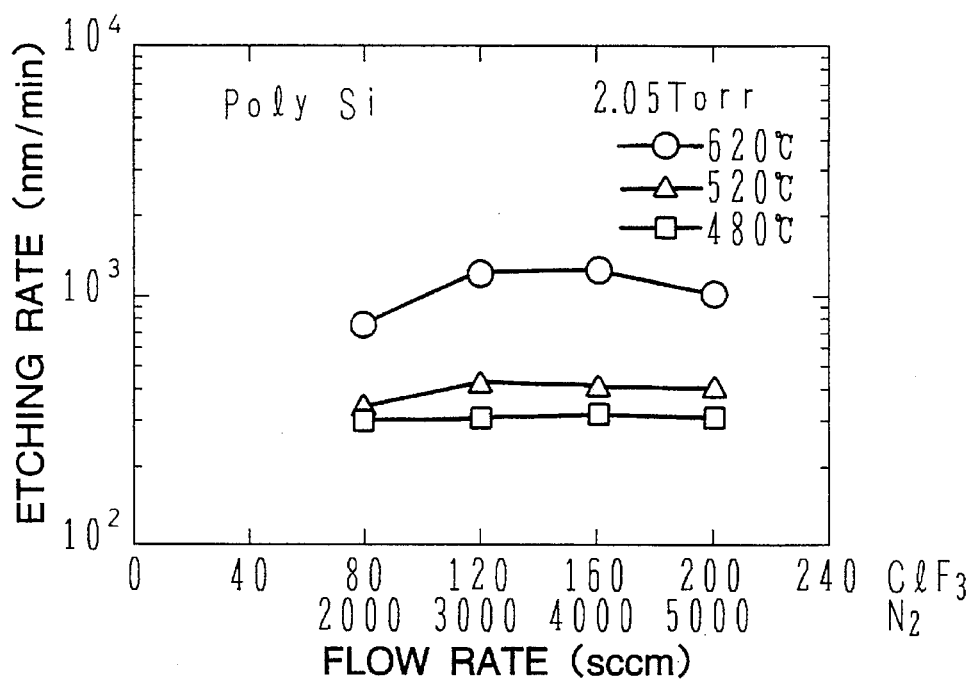
FIG. 14A is a graph showing a change in the etch rate of polycrystalline silicon, relative to a reaction tube temperature.

FIG. 14A is a graph showing a change in the etch rate of polycrystalline silicon. The abscissa represents the $ClF_3/N_2$ flow rate in unit of sccm, and the ordinate represents the etch rate in unit of nm/min. The etch rates maintain generally constant at the furnace temperatures of 480° C. and 520° C. irrespective of a change in the flow rate. In contrast with this, the etch rate lowers at the furnace temperature of 620° C. and at the flow rate of 80/2000 sccm like that shown in FIG. 13. It is supposed that at this temperature the supplied $ClF_3$ is consumed and this reduction of the supply is directly reflected upon the etch rate at the downstream position.

Figure 14B:
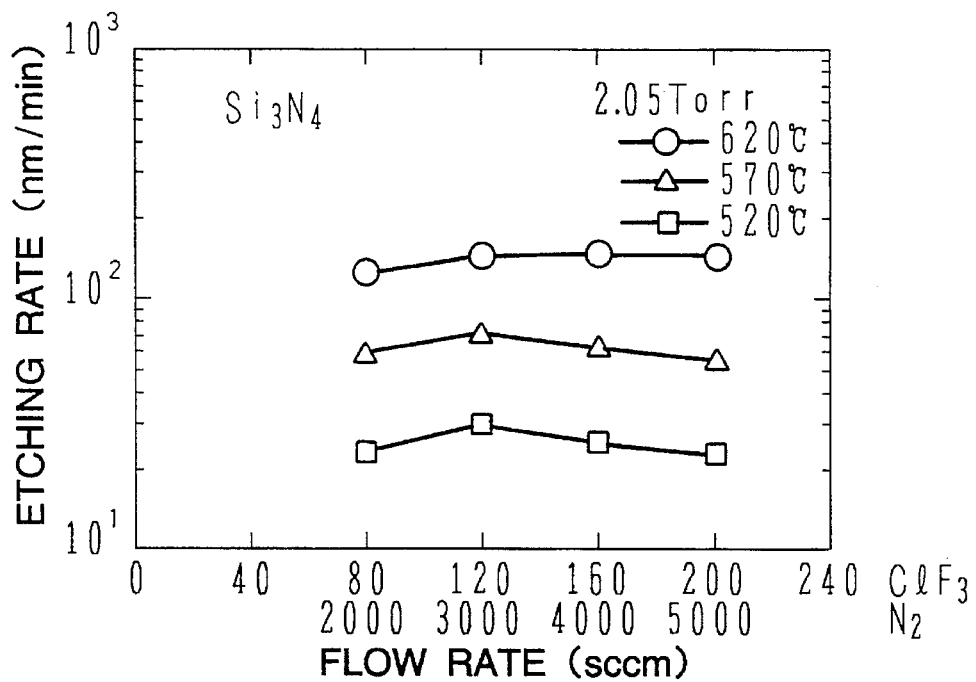
FIG. 14B is a graph showing a change in the etch rate of an $Si_3N_4$ film, relative to a reaction tube temperature.

FIG. 14B is a graph showing a change in the etch rate of an $Si_3N_4$ film relative to the flow rate. The abscissa and ordinate are the same as those shown in FIG. 14A. The etch rate of $Si_3N_4$ lowers at each temperature in the region at the flow rate of 120/3000 sccm or lower. This etch rate reduction is supposed to result from a supply reduction of the etching gas similar to the etch rate of polycrystalline silicon at the temperature of 620° C. The etch rate lowers at the temperature of 570° C. or lower in the range at the flow rate of 120/3000 sccm or higher, as the flow rate lowers (i.e., as the residence time of the etching gas in the furnace becomes longer). The etch rate lowers at 620° C. as the flow rate lowers. This is supposed to result from a reduction of active species.

Figure 14C:
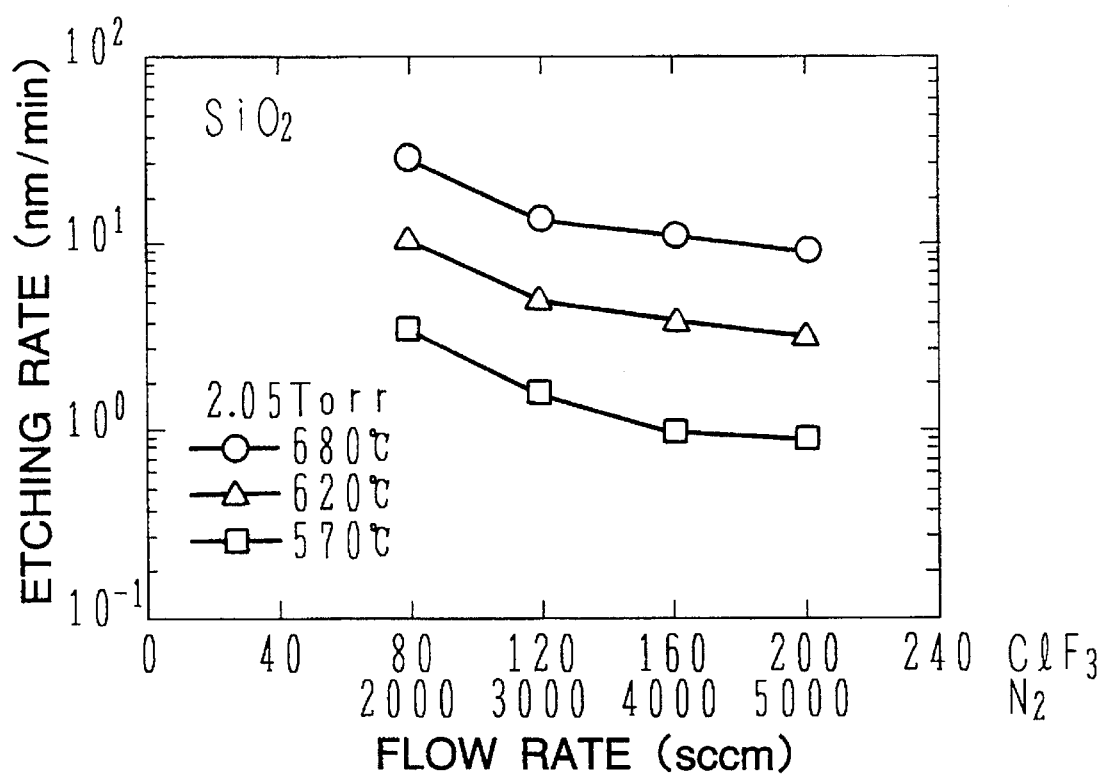
FIG. 14C is a graph showing a change in the etch rate of an $SiO_2$, relative to a reaction tube temperature.

FIG. 14C is a graph showing a dependency of an $SiO_2$ etch rate upon a flow rate. The abscissa and ordinate are the same as those shown in FIGS. 14A and 14B. The etch rate of $SiO_2$ rises as the flow rate lowers at all temperatures of 570° C., 620° C., and 680° C. This is supposed that active species contributing to etching increase as the residence time becomes longer.

Major etching species for polycrystalline silicon in $ClF_3$ gas supplied to a quartz tube may be $ClF$, $F_2$. Major etching species for $Si_3N_4$ may be $F_2$, particularly hot $F_2$. Major etching species for $SiO_2$ may be $F^*$ (fluorine radicals).

Hot $F_2$ molecules are supposed to increase as the cleaning gas flows toward the downstream position in a heated reaction tube. It is also supposed that hot molecules increase even on the upstream side if the temperature of a reaction tube is higher than a certain value.

The change in the $Si_3N_4$ etch rate shown in FIG. 14B can be clarified from the above-described operation performances.

Fluorine radicals are supposed to be generated by a collision with other molecules in the reaction tube. It can therefore be assumed that the amount of fluorine radicals increases more as the gas moves nearer to the downstream position and the pressure in the reaction tube becomes higher.

FIG. 15 is a schematic diagram illustrating a change in the amount of fluorine radicals in a reaction tube. As a mixed gas of $ClF_3+N_2$ is supplied from the upstream side, the amount of fluorine radicals increases as the gas flows toward the downstream. Assuming that the material to be cleaned is etched by $ClF_3$ molecules ($ClF+F_2$ molecules), etching progresses also on the upstream side and the etch rate lowers toward the downstream position because of the consumption of $ClF_3$ gas. Alternatively, assuming that the material to be cleaned is etched by fluorine radicals, the etch rate rises toward the downstream.

Si is a covalent bonded substance and the percentage of ionic bonds can be assumed to be 0. $Si_3N_4$ has about 30% of ionic bonds, and $SiO_2$ has about 55% of ionic bonds. A substance of ionic bonds can be etched by fluorine radicals, but is difficult to be etched by $F_2$ molecules and $ClF$ molecules. From these facts, $SiO_2$ is etched mainly by fluorine radicals so that the etch rate becomes higher as the cleaning gas flows toward the downstream position.

It is also known that the thickness of a gas flow layer having a low speed, called a boundary or stationary layer, is proportional to a pressure of ambient gas. A thick stationary layer makes it difficult to diffuse gas molecules. It is supposed that radicals generated in a high speed gas region are more easy to pass through a thin stationary layer and reach the material to be cleaned. That is to say, under the same $ClF_3$ partial pressure, as the pressure in a reaction tube is raised by supplying dilution gas, the stationary layer becomes thin and the $SiO_2$ etch rate rises. Under a constant $ClF_3$ partial pressure, it is preferable to use as small an amount of dilution gas as possible in order to make the stationary layer thick and protect the surface of a quartz tube.

In contrast, silicon is etched also by molecules so that the silicon etch rate becomes higher as the cleaning gas flows nearer to the downstream position. With these assumptions, the above-described measurement results can be understood.

It is also supposed that even if a stationary layer is thick, etching progresses by molecules in the stationary layer, without being susceptible to the influence of pressure.

Figure 16:
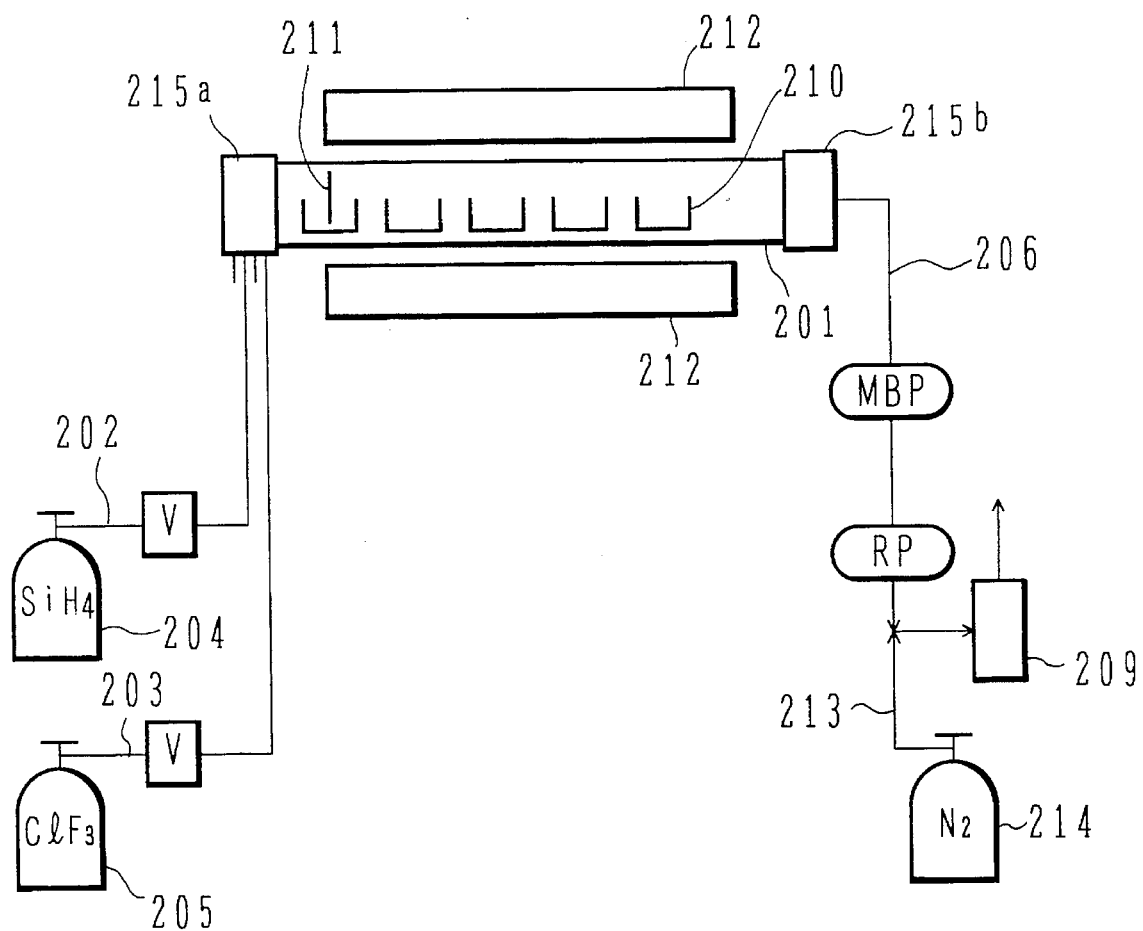
FIG. 16 is a schematic diagram showing the structure of a lateral manifold type low pressure CVD system used by another embodiment of this invention.

FIG. 16 is a schematic diagram showing the structure of a lateral manifold type low pressure CVD system used by another embodiment of this invention. A reaction tube 201 is made of quartz glass, and the opposite ends thereof being closed by flanges 215a and 215b. The flange 215a on the upstream side functions as a manifold to which gas pipes 202 and 203 are coupled. The pipe 202 is connected to an $SiH_4$ source 204, and the pipe 203 is connected to a $ClF_3$ source 205. A flow control system V including such as a valve and a mass flow controller is connected to each of the pipes 202 and 203. Purge and dilution gas supply systems are also coupled to the manifold flange 215a.

The flange 215b on the downstream side is connected to a gas exhaust pipe 206 to which a mechanical booster pump MBP and a rotary pump RP for the gas exhaust are serially connected. The output side of the rotary pump RP is connected to an $N_2$ pipe 213 which is connected to an $N_2$ source 214 to supply $N_2$ gas. The output side of the rotary pump RP is also connected to a toxic waste remover 209 which accommodates therein adsorbent such as $CaF_2$ and $CaCl_2$. Toxic gas (Cl, F, and other gases) generated from cleaning gas such as $ClF_3$ gas is adsorbed by the toxic waste remover 209, and non-dangerous gas such as $H_2O$ and $N_2$ is exhausted from the toxic waste remover 209. A heater 212 is disposed around the reaction tube 201 so as to heat the inside of the reaction tube 201.

Five baskets 210 are disposed in the reaction tube 201.

The process of cleaning the inside of the CVD furnace shown in FIG. 16 by $ClF_3$ gas after performing a process of forming a polycrystalline silicon thin film a plurality of times will be described.

A polycrystalline silicon thin film forming process is performed a plurality of times by placing Si wafers in the baskets, under the conditions of, for example, a furnace temperature of 620° C., a furnace pressure of 0.2 Torr, and an $SiH_4$ flow rate of 50 sccm. A furnace cleaning process is performed when the thickness of polycrystalline silicon attached to the inner wall of the reaction furnace 201 becomes, for example, 10 μm. The furnace cleaning process is performed, for example, under the conditions that the furnace temperature is maintained at 620° C. similar to the film forming process, $ClF_3$ is flown from the upstream gas pipe at a flow rate of 250 sccm, and the furnace pressure is about 2.0 Torr. $N_2$ is mixed at the position at least downstream of the center of the gas exhaust system, for example, at the second stage gas exhaust machine, to thereby lower the $ClF_3$ concentration. The $N_2$ flow rate is 5 slm, for example.

In the above description, $ClF_3$ 100% gas is supplied to the reaction furnace 100. If necessary, $N_2$ gas may be mixed by a certain amount or less. For example, $N_2$ gas may be mixed in order to make a gas flow uniform. It is however preferable to set the $ClF_3$ concentration to 60 mol % or higher.

It was found that even pure $ClF_3$ gas does not attack the seals and metal parts when the pressure is less than about 10 Torr.

If $ClF_3$ gas having a concentration of 60 mol % or higher is supplied directly to the toxic waste remover, there is a possibility of raising the temperature of the toxic waster remover too high. It is therefore preferable to mix $N_2$ gas to the gas exhaust system at the position at least downstream of the first stage machine of the gas exhaust system and to dilute the $ClF_3$ gas concentration to 5% or smaller. It is necessary to mix $N_2$ gas at such a position as the gas does not raise the pressure in the reaction tube.

Figure 17:
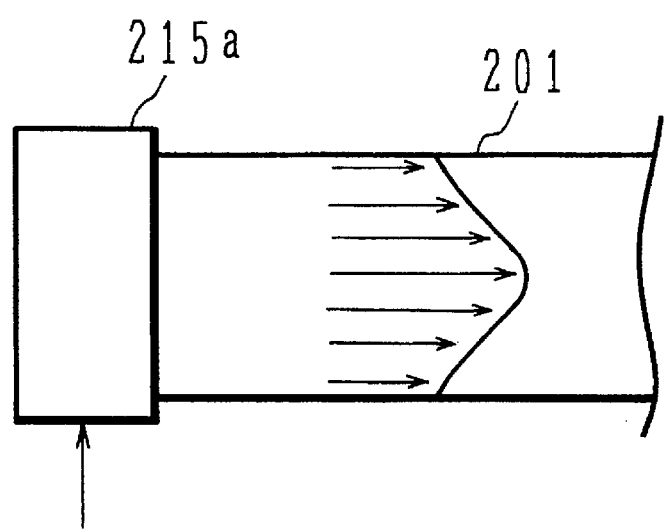
FIG. 17 is a schematic diagram illustrating a gas flow in a lateral manifold type CVD furnace.

Cleaning is desired to be performed rapidly. To this end, $ClF_3$ of a certain amount or more is required to be introduced into the reaction furnace. A large amount of cleaning gas flows in the reaction tube as compared to the film forming process, so that the inner wall of the reaction tube is cooled on the upstream side. Gas flows at a relatively uniform speed in a reaction furnace, particularly in a lateral manifold type CVD furnace, as illustrated in FIG. 17. The inner wall of the reaction tube is therefore cooled greatly if the gas flow rate is high.

For example, gas having a total flow rate of 5250 sccm, including $ClF_3$ of 250 sccm diluted with $N_2$ of 5 slm, was introduced into the reaction furnace shown in FIG. 16 from the upstream side, by using the conventional method. A polycrystalline silicon film was left on the inner wall at the upstream area. This indicates that a large amount of gas cools the inner wall of the reaction furnace at the upstream area and suppresses the cleaning effect. In order to prevent such an irregularity of cleaning, it is preferable to mount a baffle plate 211 at the upstream position, as indicated by a broken line in FIG. 16. It can be expected that the baffle plate 211 obstructs the uniform gas flow in the reaction tube and generates a turbulent flow and that an average gas flow speed lowers even at the area upstream of the baffle plate 211.

In order to check the enhancement of heating by a lowered gas speed and the turbulent flow effect, the cleaning effects with the baffle plate mounted at the front end of the heater were compared to the cleaning effects with the baffle plate mounted inside of the front end of the heater. The former cleaning effects were visually confirmed to be greater than the latter cleaning effects and provide a uniform cleaning over the whole inner area of the reaction tube. It is supposed that the etch rate is raised by the effects of a turbulent flow downstream of the baffle plate (a spiral gas flow colliding with the inner wall of the reaction tube), rather than by the heating enhancement effects.

It is known that a gas exhaust speed of a mechanical booster pump used as a vacuum pump increases more, the lower the suction pressure is (the greater the vacuum degree is) in the range of the pressure used by the cleaning process. It is therefore effective to lower the pressure in the reaction tube so as to avoid damages of the reaction tube.

Figure 18:
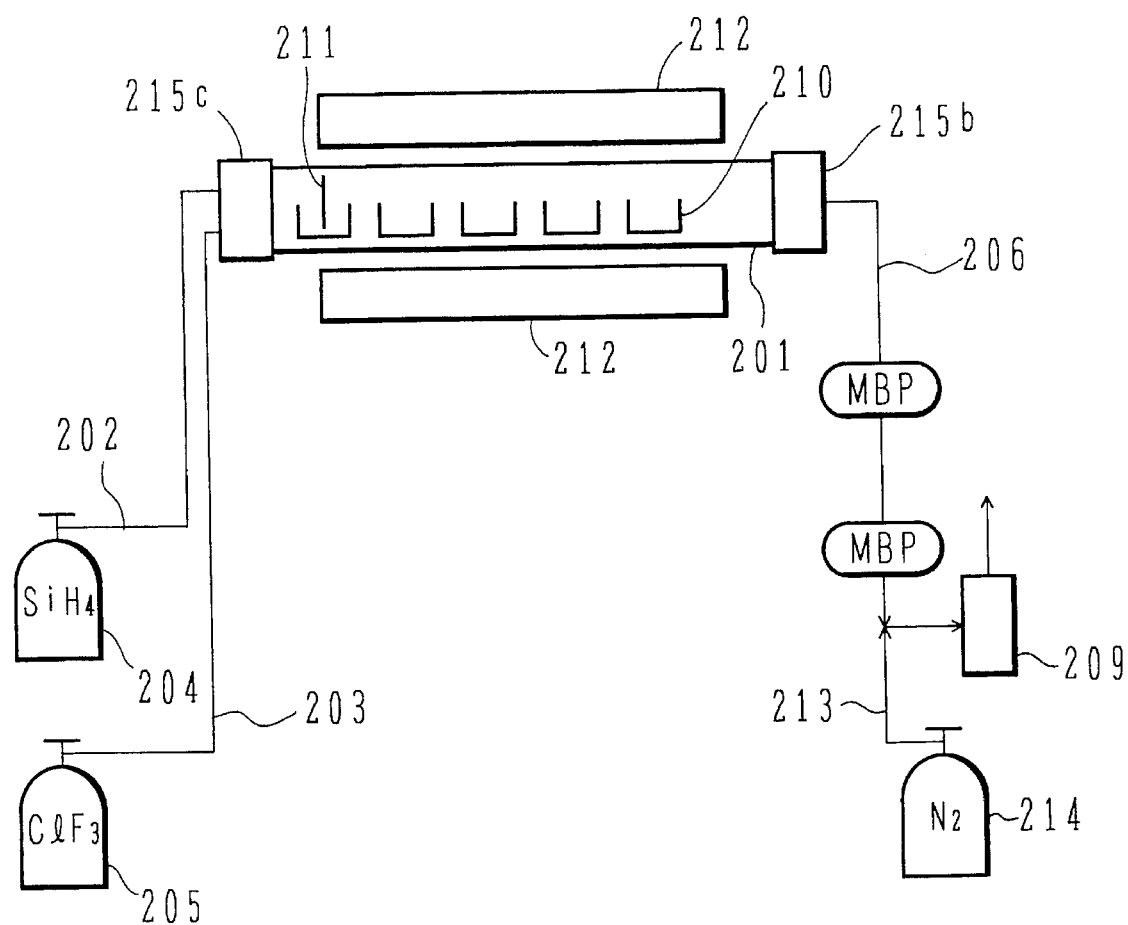
FIG. 18 is a schematic diagram showing the structure of a lateral cap type CVD furnace used by another embodiment of the invention.
Figure 19:
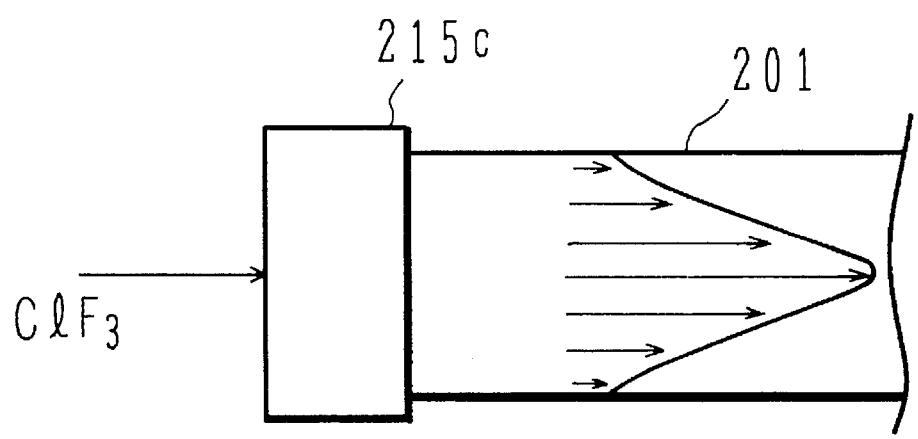
FIG. 19 is a schematic diagram illustrating a gas flow in a cap type CVD furnace.

FIG. 18 is a schematic diagram showing the structure of a lateral cap type CVD furnace used by another embodiment of the invention. A cap type flange 215c is coupled to a reaction tube 201 on the upstream side. Pipes 202, 203 and other pipes are coupled to the cap type flange 215c. First and second stage gas exhaust pumps are both mechanical booster pumps MBP. The other structure is the same as that shown in FIG. 16. For a cleaning process, $ClF_3$ 100% gas is introduced from the flange 215c of the reaction tube on the upstream side.

It is expected that the gas flow speed in the reaction tube of the cap type CVD furnace is high at the central area of the reaction tube and becomes lower toward the tube inner wall. A polycrystalline silicon layer was deposited on the inner wall of the reaction furnace shown in FIG. 18 to a thickness of about 10 μm under the conditions of a furnace temperature of about 620° C., a furnace pressure of about 0.2 Torr, and an $SiH_4$ flow rate of 50 sccm. Thereafter, a cleaning process was performed for about one hour under the conditions of a furnace temperature of about 620° C., a furnace pressure of 1.7 Torr, and a $ClF_3$ flow rate of 200 sccm diluted with $N_2$ of 5 slm. It was visually confirmed that the polycrystalline silicon layer was generally completely removed, including the layer near at the gas inlet port, by using the conventional method. This is supposed to result from small gas cooling effects because of a low gas flow speed near at the inner wall of the reaction tube. However, there is a case where a gas flow speed near at the inner wall is desired to be raised in order to speed up the etching of polycrystalline silicon or other materials on the inner wall of the reaction tube. In such a case, it is preferable to mount a baffle plate 211 indicated by a broken line in FIG. 18 at the upstream position of the reaction tube. A high speed gas flow at the central area of the reaction tube is obstructed by the baffle plate and a turbulent flow is generated, so that the same conditions as the manifold type CVD furnace is supposed to be provided. Also in this embodiment, it is supposed that the higher the concentration of the $ClF_3$ cleaning gas is, the more the etching of the quartz reaction tube and jigs can be suppressed.

A combination of this embodiment and each embodiment shown in FIGS. 1 to 7 provides a more efficient cleaning.

Figure 20:
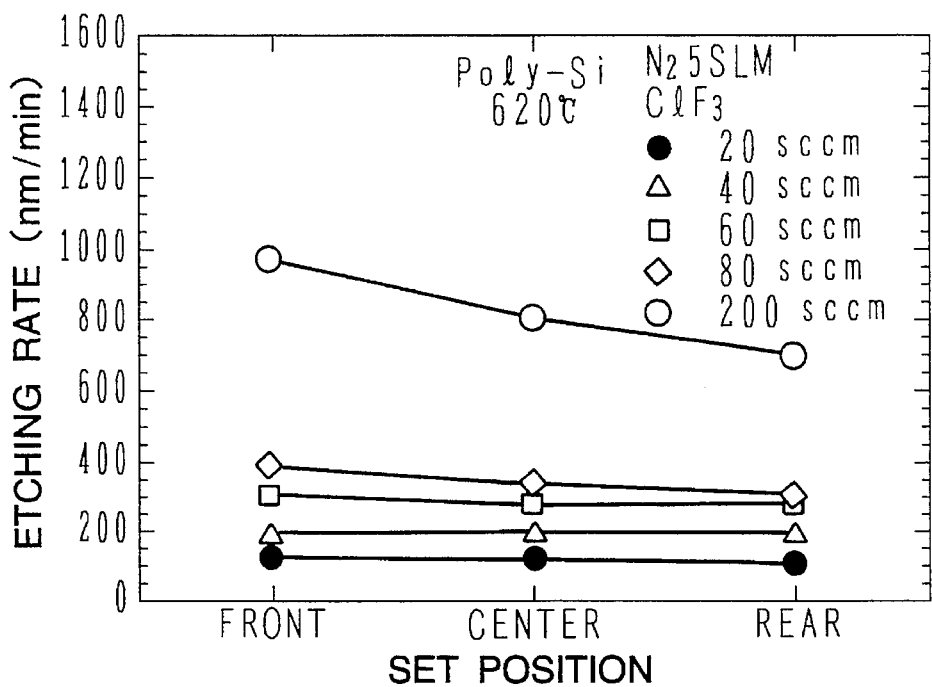
FIG. 20 is a graph showing an etch rate of polycrystalline silicon relative to a position in the reaction tube shown in FIG. 18 into which $ClF_3+N_2$ cleaning gas is introduced.

FIG. 20 is a graph showing an etch rate of polycrystalline silicon relative to a position in the reaction tube shown in FIG. 18 into which $ClF_3+N_2$ cleaning gas is introduced. The furnace temperature was set to about 620° C., the $N_2$ flow rate was fixed to 5 slm, and the $ClF_3$ flow rate was changed between 20, 40, 60, 80, and 200 (sccm). The corresponding reaction tube pressures were 1.52, 1.55, 1.54, 1.55, and 1.58 Torr.

The etch rate of polycrystalline silicon is low at the low $ClF_3$ flow rate. In order to obtain a high etch rate, it is desired to increase the $ClF_3$ flow rate.

As seen from the curve of the flow rate of 200 sccm, as the $ClF_3$ flow rate is raised, the positional dependency of the etch rate becomes distinctive. The etch rate is high at the upstream area, and it lowers toward the downstream position.

Figure 21:
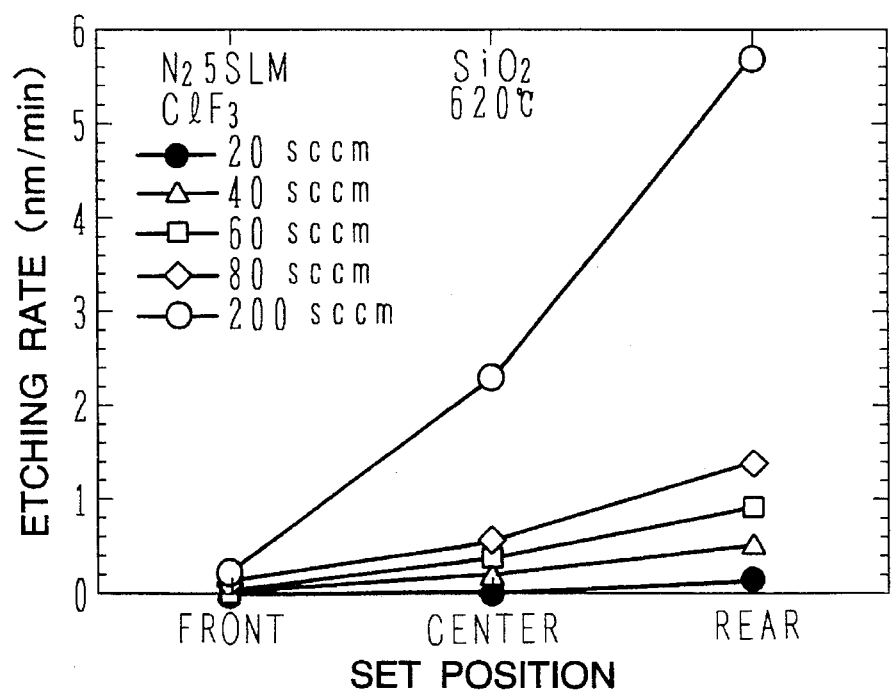
FIG. 21 is a graph showing an etch rate of $SiO_2$ relative to a position in the reaction tube shown in FIG. 18 into which $ClF_3+N_2$ cleaning gas is introduced.

FIG. 21 is a graph showing an etch rate of $SiO_2$ relative to a position in the reaction tube shown in FIG. 18 into which $ClF_3+N_2$ cleaning gas is introduced. The furnace temperature, $N_2$ flow rate, and $ClF_3$ flow rate are the same as FIG. 20. The corresponding pressures in the reaction furnace were about 1.50, 1.55, 1.54, 1.54, and 1.59 Torr. As the $ClF_3$ flow rate is increased, the $SiO_2$ etch rate increases and its positional dependency becomes very distinctive. The etch rate becomes higher at the position more downstream of the reaction tube.

In each embodiment shown in FIGS. 1 to 7, a supply of $N_2$ gas is stopped or reduced, and $ClF_3$ cleaning gas having a concentration of 60 mol % or higher is introduced into the reaction tube via a plurality of gas supply ports formed in the wall of the reaction tube. By reducing the $N_2$ gas flow rate and supplying $ClF_3$ gas at a plurality of positions of the reaction tube, it is possible to lower the furnace pressure, to suppress activation of at least $ClF_3$ gas supplied at the downstream position, and to prevent excessive etching of quartz. In the case of the embodiment shown in FIG. 1, it is sufficient only if a supply of $N_2$ gas from the $N_2$ gas source 31 is stopped.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of cleaning a reaction chamber of a semiconductor device manufacturing apparatus by supplying cleaning gas containing $ClF_3$ to said reaction chamber, said reaction chamber being adapted to exhaust gas therefrom, comprising the step of:

adding alcohol vapor to said cleaning gas.

2. A method according to claim 1, wherein said alcohol vapor is a vapor of alcohol having one to five carbon atoms.

3. A method according to claim 1, wherein a concentration of said alcohol vapor in $ClF_3$ is 0.1 to 50 mol %.

4. A method according to claim 1, further comprising the step of changing a partial pressure of said alcohol vapor contained in said cleaning gas during a cleaning process.

5. A method according to claim 1, wherein said cleaning gas is $ClF_3$ having a concentration of 60 mol % or higher.

6. A method according to claim 5, wherein said cleaning gas consists essentially of $ClF_3$.

7. A method of removing a film attached to the inner wall of a reaction chamber of a semiconductor device manufacturing apparatus by supplying cleaning gas containing $ClF_3$ to said reaction chamber, said reaction chamber being adapted to exhaust gas therefrom, comprising the steps of:

supplying said cleaning gas to said reaction chamber under a first cleaning condition at the initial stage of cleaning; and changing said cleaning condition so as to lower an etching rate by said cleaning gas of a material constituting said reaction chamber than an etching rate under said first cleaning condition at the initial stage of cleaning, wherein said changing step changes the temperature of said cleaning gas.

8. A method according to claim 7, wherein said cleaning gas is $ClF_3$ having a concentration of 60 mol % or higher.

9. A method according to claim 8, wherein said cleaning gas consists essentially of $ClF_3$.

10. A method of removing a film attached to the inner wall of a reaction chamber of a semiconductor device manufacturing apparatus by supplying cleaning gas containing $ClF_3$ to said reaction chamber, said reaction chamber being adapted to exhaust gas therefrom, comprising the steps of:

supplying said cleaning gas to said reaction chamber only via some of a plurality of gas inlet ports provided for said reaction chamber;

switching said gas inlet ports to stop supplying said cleaning gas via some of said gas inlet ports, and to start supplying said cleaning gas via another of said gas inlet ports.

11. A method according to claim 10, wherein said switching step is performed at least twice or more.

12. A method according to claim 10, wherein said switching step switches said gas inlet ports in the order from an upstream region to a downstream region of a gas flow in said reaction chamber.

13. A method according to claim 10, wherein said cleaning gas is $ClF_3$ having a concentration of 60 mol % or higher.

14. A method according to claim 13, wherein said cleaning gas consists essentially of $ClF_3$.

15. A cleaning method for cleaning a CVD furnace having a quartz reaction tube open at opposite ends, gas supply means connected to one end of said reaction tube, gas evacuation means connected to the other end of said reaction tube and having at least a first stage gas evacuation system, and a heater disposed surrounding said reaction tube, said cleaning method comprising the steps of:

introducing a cleaning gas from said gas supply means into said reaction tube in a heated state, said cleaning gas containing $ClF_3$ having a concentration of 60 mol % or more; and mixing an inert gas with said cleaning gas at the position at least downstream of the first stage gas evacuation system of said gas evacuation means.

16. A method according to claim 15, wherein said cleaning gas consists essentially of $ClF_3$.

17. A method according to claim 15, wherein said step of introducing the cleaning gas is performed by mounting a baffle plate at or near a position in the reaction tube corresponding to a front end of the heater.

18. A method according to claim 15, wherein said first stage gas evacuation system of said gas evacuation means is a mechanical booster pump.

19. A method of cleaning a reaction chamber of a semiconductor device manufacturing apparatus by supplying cleaning gas containing $ClF_3$ to the reaction chamber, with an interior of the reaction chamber being at an elevated temperature, the reaction chamber being adapted to exhaust gas therefrom, said method further comprising the step of adding alcohol vapor to said cleaning gas.

20. A method of removing a film attached to the inner wall of a reaction chamber of a semiconductor device manufacturing apparatus by supplying cleaning gas containing $ClF_3$ to said reaction chamber, said reaction chamber being adapted to exhaust gas therefrom, comprising the steps of:

maintaining said reaction chamber at an elevated temperature;

supplying said cleaning gas to said reaction chamber only via some of a plurality of gas inlet ports provided for said reaction chamber; and switching said gas inlet ports to stop supplying said cleaning gas via some of said gas inlet ports, and to start supplying said cleaning gas via another of said gas inlet ports.

21. A cleaning method for cleaning a CVD furnace having a quartz reaction tube open at opposite ends, gas supply means connected to one end of said reaction tube, gas evacuation means connected to the other end of said reaction tube and having at least a first stage gas evacuation system, and a heater disposed surrounding said reaction tube, said cleaning method comprising the steps of:

maintaining the reaction tube at an elevated temperature;

introducing a cleaning gas from said gas supply means into said reaction tube in a heated state, said cleaning gas containing $ClF_3$ having a concentration of 60 mol % or more; and mixing an inert gas with said cleaning gas at the position at least downstream of the first stage gas evacuation system of said gas evacuation means.

* * * * *